United States Patent
Yu et al.

(10) Patent No.: US 10,354,964 B2
(45) Date of Patent: Jul. 16, 2019

(54) INTEGRATED DEVICES IN SEMICONDUCTOR PACKAGES AND METHODS OF FORMING SAME

(71) Applicant: Taiwan Semiconductor Manufacturing Company, Ltd., Hsinchu (TW)

(72) Inventors: Chen-Hua Yu, Hsinchu (TW); Kai-Chiang Wu, Hsinchu (TW); Chung-Shi Liu, Hsinchu (TW); Shou Zen Chang, Panchiao (TW); Chao-Wen Shih, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/725,677

(22) Filed: Oct. 5, 2017

(65) Prior Publication Data

US 2018/0247905 A1 Aug. 30, 2018

Related U.S. Application Data

(60) Provisional application No. 62/463,445, filed on Feb. 24, 2017.

(51) Int. Cl.
*H01L 23/66* (2006.01)
*H01L 23/538* (2006.01)
(Continued)

(52) U.S. Cl.
CPC .......... *H01L 23/66* (2013.01); *H01L 21/4853* (2013.01); *H01L 21/4857* (2013.01); *H01L 21/561* (2013.01); *H01L 21/565* (2013.01); *H01L 21/568* (2013.01); *H01L 21/78* (2013.01); *H01L 23/3114* (2013.01); *H01L 23/5383* (2013.01); *H01L 23/5386* (2013.01); *H01L 23/5389* (2013.01); *H01L 23/552* (2013.01); *H01L 24/19* (2013.01); *H01L 24/20* (2013.01); *H01L 24/96* (2013.01); *H01L 25/105* (2013.01); *H01L 25/50* (2013.01); *H01P 3/003* (2013.01); *H01Q 1/2283* (2013.01); *H01Q 1/38* (2013.01); *H01Q 9/0457* (2013.01); *H01L 2223/6616* (2013.01); *H01L 2223/6627* (2013.01); *H01L 2223/6677* (2013.01); *H01L 2224/214* (2013.01); *H01L 2224/95001* (2013.01); *H01L 2224/97* (2013.01); *H01L 2225/1035* (2013.01);
(Continued)

(58) Field of Classification Search
CPC ......... H01L 23/66; H01L 21/48; H01L 21/56; H01L 21/78; H01L 23/31; H01L 23/53; H01L 23/55; H01L 24/19; H01L 24/20
USPC ........................................................ 257/428
See application file for complete search history.

(56) References Cited

U.S. PATENT DOCUMENTS 9,000,584 B2 4/2015 Lin et al.
9,048,222 B2 6/2015 Hung et al.
(Continued)

*Primary Examiner* — Fazli Erdem
(74) *Attorney, Agent, or Firm* — Slater Matsil, LLP

(57) ABSTRACT

An embodiment package comprises an integrated circuit die encapsulated in an encapsulant, a patch antenna over the integrated circuit die, and a dielectric feature disposed between the integrated circuit die and the patch antenna. The patch antenna overlaps the integrated circuit die in a top-down view. The thickness of the dielectric feature is in accordance with an operating bandwidth of the patch antenna.

20 Claims, 29 Drawing Sheets

(51) Int. Cl.
*H01L 23/00* (2006.01)
*H01L 21/56* (2006.01)
*H01L 21/48* (2006.01)
*H01L 21/78* (2006.01)
*H01L 23/552* (2006.01)
*H01L 25/10* (2006.01)
*H01L 25/00* (2006.01)
*H01P 3/00* (2006.01)
*H01Q 1/22* (2006.01)
*H01Q 1/38* (2006.01)
*H01L 23/31* (2006.01)
*H01Q 9/04* (2006.01)
*H01Q 21/06* (2006.01)

(52) U.S. Cl.
CPC ............. *H01L 2225/1058* (2013.01); *H01L 2924/3025* (2013.01); *H01Q 21/065* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2014/0152509 A1* | 6/2014 | Liu ............... H01Q 9/0407 343/700 MS |
| 2014/0184460 A1* | 7/2014 | Yen ............... H01Q 13/106 343/770 |
| 2015/0340765 A1* | 11/2015 | Dang ............. H01Q 21/0075 343/893 |
| 2016/0104940 A1* | 4/2016 | Wang ............. H01Q 1/2283 343/836 |
| 2016/0218072 A1* | 7/2016 | Liao ............... H01L 23/66 |
| 2017/0278808 A1* | 9/2017 | Liao ............... H01L 23/66 |
| 2017/0346185 A1* | 11/2017 | Wang ............. H01Q 1/36 |
| 2018/0159203 A1* | 6/2018 | Baks ............... H01Q 1/2283 |

\* cited by examiner

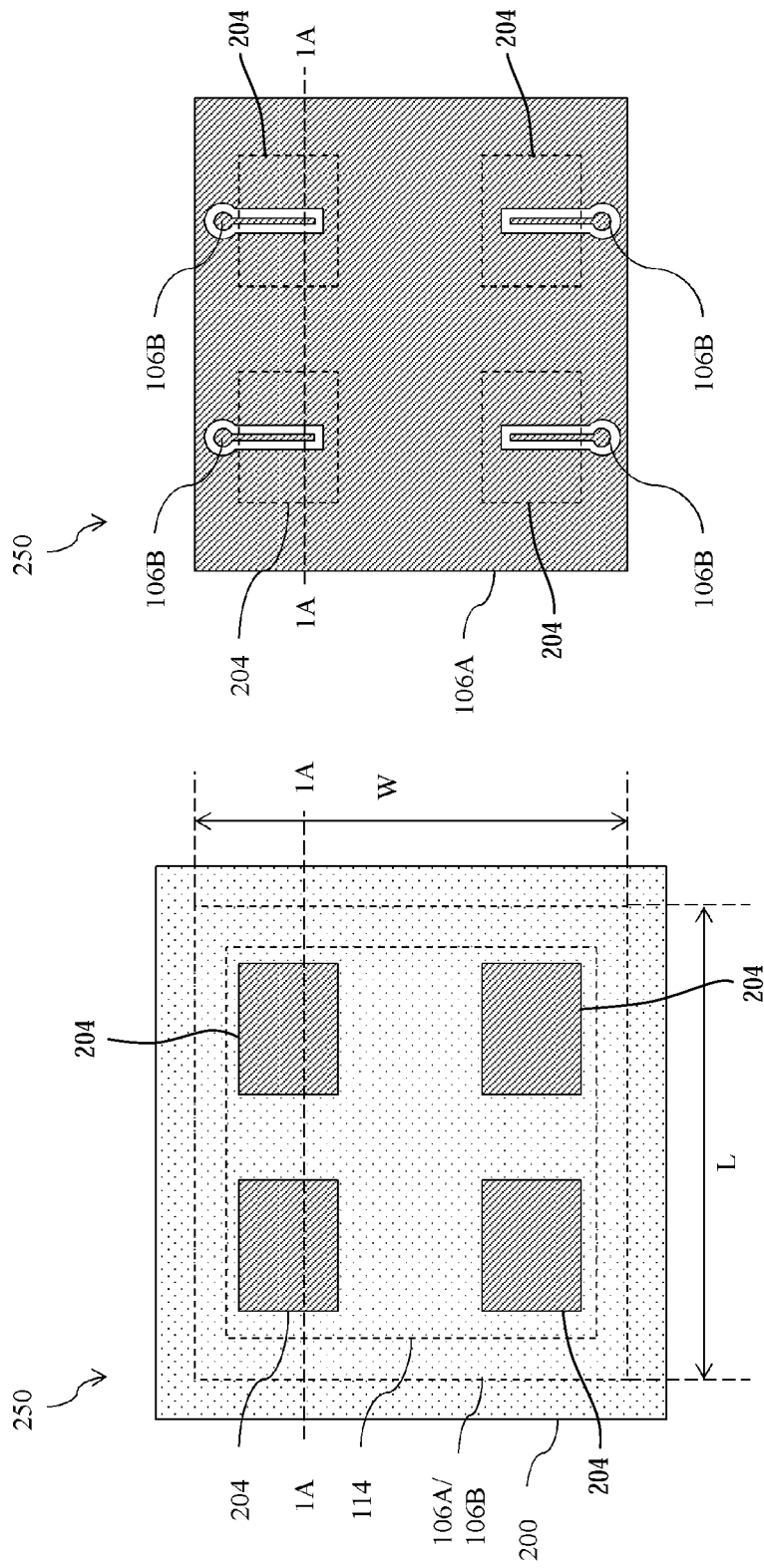

ated devices in semiconductor packages and methods of forming same

PRIORITY CLAIM AND CROSS-REFERENCE

This patent application claims priority to U.S. Provisional Application No. 62/463,445, filed on Feb. 24, 2017 and entitled "Integrated Antennas in Semiconductor Packages and Methods of Forming the Same," which application is hereby incorporated by reference herein as if reproduced in its entirety.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, and 1C illustrate varying views of a semiconductor package in accordance with some embodiments.

DETAILED DESCRIPTION

Figure 1A:
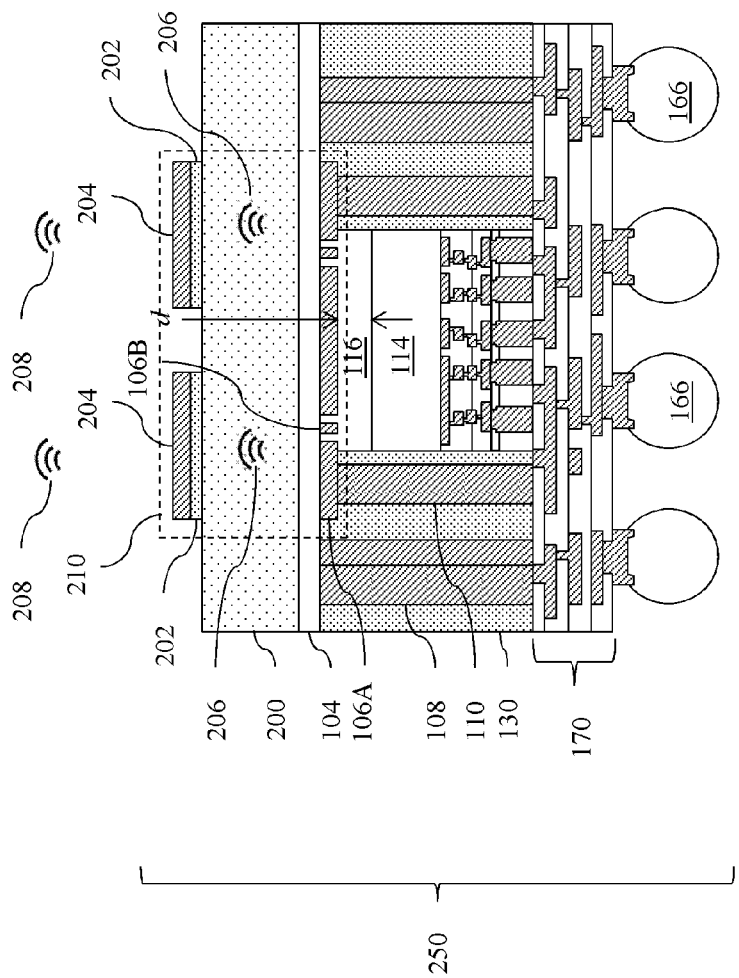

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure having one or more integrated antennas and one or more semiconductor chips (e.g., a radio frequency (RF) chip, baseband chip, etc.). However, various embodiments may also be applied to other packages having embedded functional elements (e.g., waveguide lines) integrated with one or more semiconductor chips.

In embodiments having an integrated antenna, the integrated antennas include a patch antenna having one or more signal lines (also referred to herein as feed lines), a ground element, and one or more radiating elements. During operation, the RF chip receives and transmits signals to and from the radiating elements of the patch antenna through the feed lines. The ground element comprises a ground line and/or a ground plane providing electrical ground for the one or more radiating elements. By integrating antennas and semiconductor chips in a single package, reductions in size can be achieved.

In order to advantageously achieve a small package footprint, portions of the patch antenna overlap at least one semiconductor chip in a top down view. However, it has been observed that this overlap can result in reduced efficiency of the patch antenna due to interference caused by the semiconductor chip. Various embodiments aim to improve the efficiency of the patch antenna and reduce interference from the semiconductor chip by disposing a dielectric feature between the semiconductor chip and the patch antenna (e.g., feed lines and ground element(s) of the patch antenna). In some embodiments, the dielectric feature comprises a die attach film (DAF) used to attach the semiconductor chip to the package during manufacturing. A thickness of the dielectric feature is selected in order to achieve a desired efficiency for the patch antenna. The thickness may further correspond to a distance between the patch antenna and the semiconductor chip. For example, it has been observed that a relatively thick dielectric feature may provide improved isolation between the patch antenna and the semiconductor chip. In some embodiments, the thickness of the dielectric feature is selected based on an operating bandwidth of the antenna, a k-value of the dielectric feature, an area of various features of the patch antenna, a desired efficiency of the patch antenna, combinations thereof, and the like.

FIG. 1A illustrates a cross-sectional view of a semiconductor package 250 in accordance with some embodiments.

FIGS. 1B and 1C illustrate top-down views of the semiconductor package 250 in accordance with some embodiments. The cross-sectional view of FIG. 1A is taken alone lines 1A-1A of FIGS. 1B and 1C.

Referring first to FIG. 1A, the semiconductor package 250 includes an integrated circuit die 114 encapsulated in an encapsulant 130. The integrated circuit die 114 may be a radio frequency (RF) chip, which may or may not include a baseband processor integrated within the integrated circuit die 114. Although only one integrated circuit die is illustrated in the semiconductor package 250, multiple integrated circuit dies 114 (e.g., a separate baseband chip, processors, memory, etc.) may be integrated in a single semiconductor package in other embodiments depending on package design. In such embodiments, each of the multiple integrated circuit dies 114 may be encapsulated in the encapsulant 130.

During operation, the integrated circuit die 114 transmits and receives wireless signals by way of one or more antennas integrated in the semiconductor package 250. For example, semiconductor package 250 includes a patch antenna 210 comprising a ground element 106A, feed lines 106B, a portion of a dielectric layer 200, and radiating elements 204. In package 250, the ground layer 106A and the feed lines 106B are disposed in a same layer. For example, the feed lines 106B may be disposed in openings extending through the ground element 106A as illustrated by FIGS. 1A and 1C. In the embodiments of FIGS. 1A, 1B, and 1C, ground element 106A may further provide shielding (e.g., electromagnetic radiation shielding) for the feed lines 106B. Top and bottom surfaces of the ground 106A and the feed lines 106B may be substantially co-planar. The locations of the radiation elements 204 are marked as dashed lines in FIG. 1C for reference. Other configurations (e.g., having a greater or fewer number of feed lines) of an embodiment patch antenna may be used in other embodiments.

The integrated circuit die 114 is electrically connected to the ground element 106A and the feed lines 106B through redistribution lines in redistribution structure 170 and conductive vias 110. For example, the redistribution structures 170 may include a plurality of conductive redistribution lines disposed in one or more dielectric layers. The conductive vias 110 are disposed in the molding compound 130 and electrically connect the ground element 106A and the feed lines 106B to the redistribution lines in the redistribution structure 170. Thus, the conductive vias 110 electrically connects the ground element 106A and the feed lines 106B to the integrated circuit die 114. The redistribution lines in the redistribution structure 170 further electrically connects the integrated circuit die 114 to external connectors 166, which may be used to bond the package 250 to another package component, such as, a package substrate (see FIG. 25).

In some embodiments, the radiating elements 204 are separated from the ground element 106A and the feed lines 106B by dielectric layer 200 and optional dielectric layer 104. For example, the radiating elements 204 may be adhered to a surface of the dielectric layer 200 opposing the ground element 106A/feed lines 106B. The radiating elements 204 may be adhered to the dielectric layer 200 using an adhesive 202, or the adhesive 202 may be omitted. The radiating elements 204 are electrically coupled to the ground element 106A and the feed lines 106B. In some embodiments, a material of the dielectric layer 200 may be selected to promote this electric coupling and may have a relatively low dissipation factor (DF). For example, a DF of the dielectric layer 200 may be less than about 0.01 or even less than about 0.001 in some embodiments. The ground element 106A may provide a ground plane for the radiating elements 204, and the feed lines 106B relay signals 206 between the radiating elements 204 and the integrated circuit die 114. The radiating elements 204, in turn, receive and transmit wireless signals 208 to and from other devices outside of the semiconductor package 250.

As illustrated by the top-down view of the package 250 provided by FIG. 1B, the integrated circuit die 114 (shown in ghost in FIG. 1B) overlaps with the ground element 106A/feed lines 106B (shown in ghost in FIG. 1B). This overlap of features may result in the patch antenna 210 (see FIG. 1A) losing efficiency. For example, efficiency of the patch antenna 210 may be lowered as a result of interference caused by the integrated circuit die 114.

In order to reduce this interference and increase the efficiency of the patch antenna 210, a dielectric feature 116 is juxtaposed between the integrated circuit die 114 and the patch antenna 210 (e.g., the ground element 106A/feed line 106B portions of the patch antenna 210). The dielectric feature 116 improves isolation between the integrated circuit die 114 and portions of the patch antenna 210 (e.g., the ground element 106A/feed lines 106B). The dielectric feature 116 has a thickness d, which is measured from a surface of the patch antenna 210 facing the integrated circuit die 114 to the integrated circuit die 114. In various embodiments, the thickness d is relatively thick in order to provide suitable isolation between the integrated circuit die 114 and the patch antenna 210. While not being bound by any particular theory, it is believed that an efficiency of the patch antenna 210 can be approximated as the parasitic capacitance between the integrated circuit die and the ground element 106B/feed lines 106A. For example, a lower parasitic capacitance between these features correlates with improved efficiency of the patch antenna 210. Furthermore, the parasitic capacitance between the integrated circuit die 114 and the ground element 106A/feed lines 106B may satisfy the following:

$$C \propto k \frac{A}{d} \propto \lambda$$

where C is the parasitic capacitance between the integrated circuit die 114 and the ground element 106A/feed lines 106B; k the a k-value of the dielectric feature 116; d is the thickness d of the dielectric feature 116; A is an area of the ground element 106A/feed lines 106B (e.g., obtained by multiplying a length L by a width W of the ground element 106A/feed lines 106B, see FIG. 1B); and λ is an operating wavelength of the patch antenna 210. Various embodiments manipulate one or more of the above parameters in order to reduce parasitic capacitance C and improve the efficiency of the patch antenna 210 in the package 250.

In various embodiments, the thickness d of the dielectric feature 116 is selected in accordance with an operating bandwidth (frequency) of the patch antenna 210, a k-value of the dielectric feature 116, an area of various features (e.g., the ground element 106A and/or the feed lines 106B) of the patch antenna 210, a desired efficiency of the patch antenna 210, combinations thereof, and the like. For example, the thickness d of the dielectric feature 116 may be at least 100 µm when a k-value of the dielectric feature 116 is about 3 or greater and the patch antenna 210 has an operating bandwidth of about 60 GHz. As another example, the thickness d of the dielectric feature 116 may be at least 30 µm when a k-value of the dielectric feature 116 is less than 3 (e.g., about 1) and the patch antenna 210 has an operating bandwidth of about 60 GHz. As another example, the thickness d of the dielectric feature 116 may be at least about 50 μm when a k-value of the dielectric feature 116 is about 3 or greater and the patch antenna 210 has an operating bandwidth of about 77 GHz. As another example, the thickness d of the dielectric feature 116 may be at least about 15 μm when a k-value of the dielectric feature 116 is less than 3 (e.g., about 1) and the patch antenna 210 has an operating bandwidth of about 77 GHz. As another example, the thickness d of the dielectric feature 116 may be at least about 120 μm when a k-value of the dielectric feature 116 is about 3 or greater and the patch antenna 210 has an operating bandwidth of about 38 GHz. As another example, the thickness d of the dielectric feature 116 may be at least about 40 μm when a k-value of the dielectric feature 116 is less than 3 (e.g., about 1) and the patch antenna 210 has an operating bandwidth of about 38 GHz.

It has been observed that when the thickness d of the integrated circuit die 114 is within the above values, an efficiency of the patch antenna 210 is within 95% of an efficiency of a baseline patch antenna without interference from an integrated circuit die. For example, experiments were conducted on the patch antennas having operating bandwidths of about 77 GHz to about 81 GHz as well as patch antennas having operating bandwidths of about 57 GHz and about 64 GHz. Comparisons were made between patch antennas integrated in packages having dielectric features with different thicknesses d of 0 μm, 20 μm, 40 μm, 50 μm, 60 μm, 80 μm, and 100 μm. Comparisons were also made between a baseline patch antenna without interference from an integrated circuit die. When the thickness d was 0 μm and the operating bandwidth of the patch antenna was about 77 GHz to about 81 GHz, a gain of the patch antenna was 7.1 dBi and an efficiency of the patch antenna was 41%. When the thickness d was 20 μm and the operating bandwidth of the patch antenna was about 77 GHz to about 81 GHz, a gain of the patch antenna was 9.7 dBi and an efficiency of the patch antenna was 70%. When the thickness d was 40 μm and the operating bandwidth of the patch antenna was about 77 GHz to about 81 GHz, a gain of the patch antenna was 10.2 dBi and an efficiency of the patch antenna was 82%. When the thickness d was 50 μm and the operating bandwidth of the patch antenna was about 77 GHz to about 81 GHz, a gain of the patch antenna was 10.3 dBi and an efficiency of the patch antenna was 84%. When the thickness d was 60 μm and the operating bandwidth of the patch antenna was about 77 GHz to about 81 GHz, a gain of the patch antenna was 10.3 dBi and an efficiency of the patch antenna was 86%. When the thickness d was 80 μm and the operating bandwidth of the patch antenna was about 77 GHz to about 81 GHz, a gain of the patch antenna was 10.4 dBi and an efficiency of the patch antenna was 88%. When the thickness d was 100 μm and the operating bandwidth of the patch antenna was about 77 GHz to about 81 GHz, a gain of the patch antenna was 10.5 dBi and an efficiency of the patch antenna was 89%. The baseline patch antenna having an operating bandwidth of about 77 GHz to about 81 GHz provided a gain of 10.5 dBi and an efficiency of the baseline patch antenna was 90%. When the thickness d was 20 μm and the operating bandwidth of the patch antenna was about 57 GHz to about 64 GHz, bandwidth specifications of the patch antenna failed, a gain of the patch antenna was 3.95 dBi, and an efficiency of the patch antenna was 42.4%. When the thickness d was 40 μm and the operating bandwidth of the patch antenna was about 57 GHz to about 64 GHz, a gain of the patch antenna was 5.3 dBi, and an efficiency of the patch antenna was 66.3%. When the thickness d was 50 μm and the operating bandwidth of the patch antenna was about 57 GHz to about 64 GHz, a gain of the patch antenna was 5.48 dBi, and an efficiency of the patch antenna was 70.6%. When the thickness d was 60 μm and the operating bandwidth of the patch antenna was about 57 GHz to about 64 GHz, a gain of the patch antenna was 5.62 dBi, and an efficiency of the patch antenna was 73.3%. When the thickness d was 100 μm and the operating bandwidth of the patch antenna was about 57 GHz to about 64 GHz, a gain of the patch antenna was 5.88 dBi, and an efficiency of the patch antenna was 78.3%. The baseline patch antenna having an operating bandwidth of about 57 GHz to about 64 GHz provided a gain of 6.12 dBi and efficiency of the baseline patch antenna was 82%.

All the above values assume a constant area A of the ground element 106A/feed lines 106B. Generally, it has also been observed that reducing area A of the ground element 106A/feed lines 106B may also allow for a smaller thickness d while still achieving a desired efficiency.

Figure 2B:
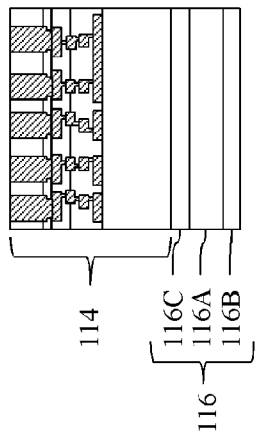
FIGS. 2A, 2B, 2C, 2D, and 2E illustrate cross-sectional views of a portion of a semiconductor package in accordance with some embodiments.
Figure 2A:
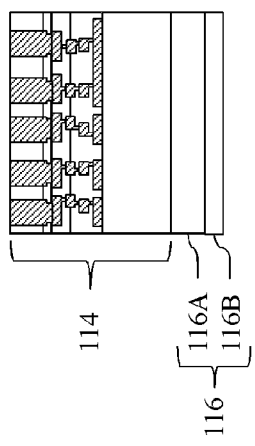
Figure 2E:
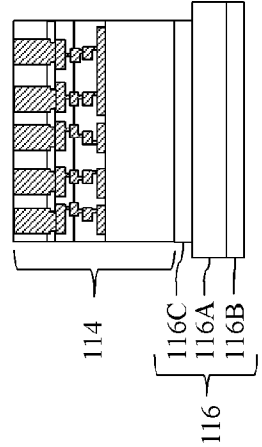
Figure 2D:
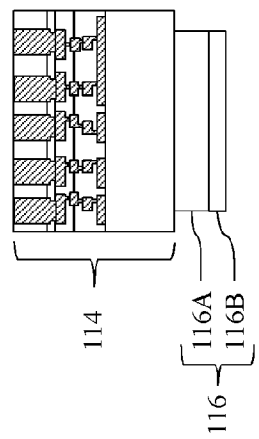
Figure 2C:
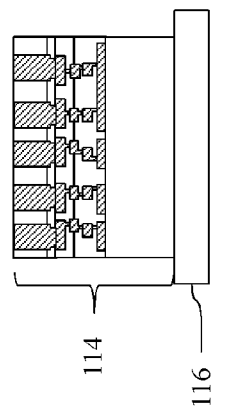

In FIG. 1A, the dielectric feature 116 is illustrated as a single dielectric layer. In other embodiments, the dielectric feature 116 may have any number of dielectric layers comprising different materials. For example, the dielectric feature 116 may have two dielectric layers 116A and 116B (e.g., as illustrated by FIG. 2A) or three dielectric layers 116A, 116B, and 116C (e.g., as illustrated by FIG. 2B). Each of the dielectric layers within the dielectric feature 116 may comprise a DAF, backside coating tape (LC) tape, a prepreg (PP) material, low-k material, or the like. The dielectric feature 116 may have a same width (e.g., measured between opposing sidewalls of the dielectric feature 116) as the integrated circuit die 114 (e.g., as illustrated by FIG. 1A), have a larger width than the integrated circuit 114 (e.g., as illustrated by FIG. 2C), or have a smaller width than the integrated circuit die 114 (e.g., as illustrated by FIG. 2D). Furthermore, each of the dielectric layers (e.g., layers 116A, 116B, and/or 116C) may have a same width (e.g., as illustrated by FIGS. 2A, 2B, 2C, and 2D) or different widths (e.g., as illustrated by FIG. 2E). When the dielectric feature 116 comprises multiple dielectric layers, a thickness and/or k-value of a dominant dielectric layer 116A may be used as an approximation for calculating thickness d to reduce parasitic capacitance. The dominant dielectric layer 116A may be a dielectric layer occupying the majority of volume (e.g., greater than 50%, such as greater than about 80%) of the overall dielectric feature 116. In other embodiments, a weighted average of k-value and/or thicknesses may be used for calculating thickness d to reduce parasitic capacitance.

The semiconductor package 250 may further include additional antennas, such as, radiating antennas 108. In some embodiments, the radiating antennas 108 comprise conductive features extending through the encapsulant 130. The radiating antennas 108 are electrically connected to the integrated circuit die 114 by redistribution lines in the redistribution structure 170. A shape and configuration of the radiating antennas 108 is selected to enable the sending and receiving of wireless signals to and from other devices (not illustrated) outside of package 250. In other embodiments, the radiating antennas 108 may be omitted.

Figure 3A:
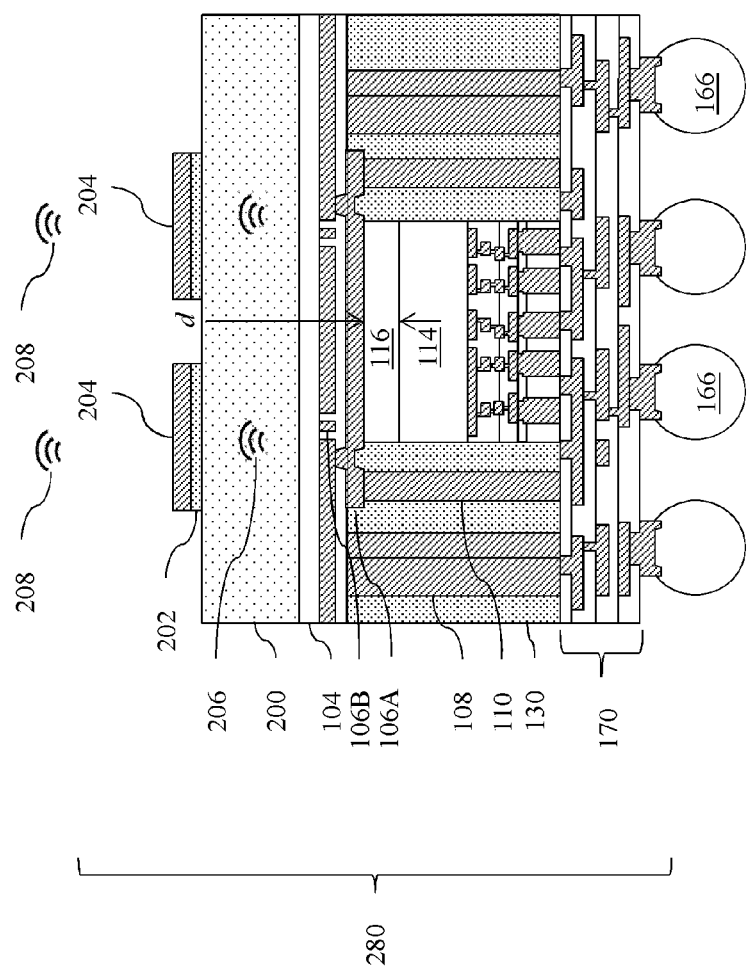
FIGS. 3A, 3B, and 3C illustrate varying views of a semiconductor package in accordance with some alternative embodiments.
Figure 3C:
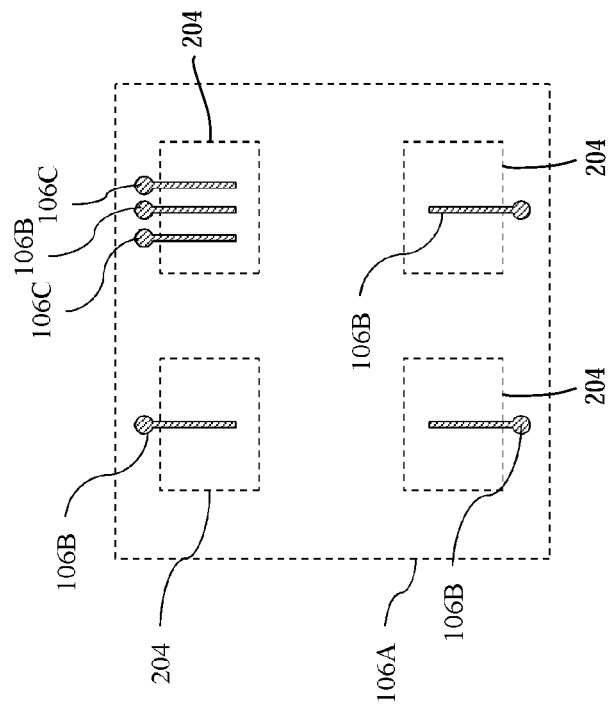
Figure 3B:
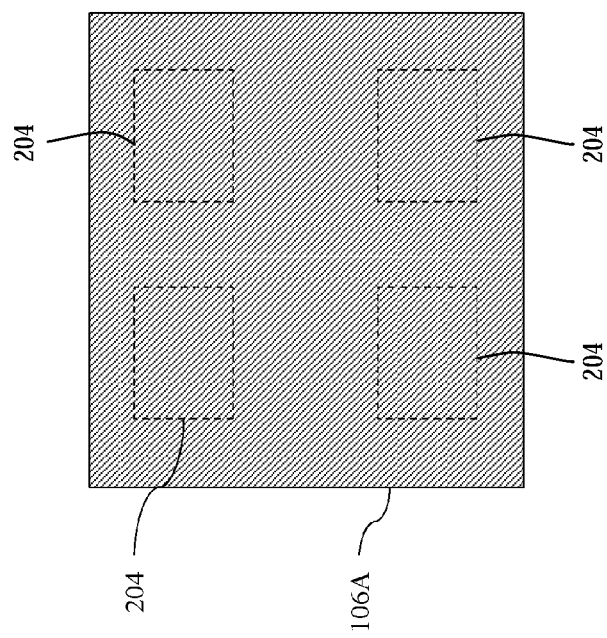

FIGS. 3A, 3B, and 3C illustrate varying views of a semiconductor package 280 according to some embodiments. FIG. 3A illustrates a cross-sectional view of semiconductor package 280; FIG. 3B illustrates top-down view of a ground element 106A, and FIG. 3C illustrates a top-down view of feed lines 106B and optional ground elements 106C. Package 280 is substantially similar to package 250 where like reference numerals indicate like elements. In package 280, the ground element 106A and the feed lines 106B are disposed in different layers. For example, the ground element 106A may be disposed between the feed lines 106B and the integrated circuit die along a line perpendicular to a lateral surface of semiconductor package 280. In some embodiments, optional additional ground elements 106C (see FIG. 3C) may be disposed in a same layer as the feed lines 106B.

Figure 4:
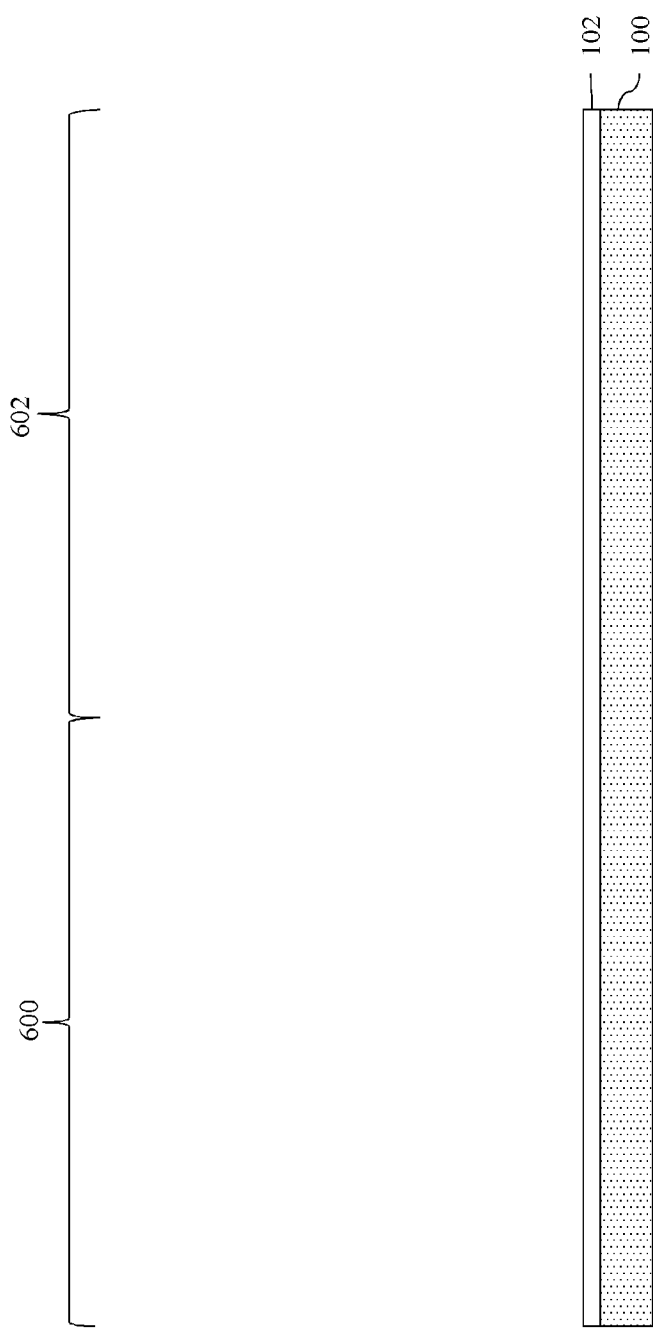
FIGS. 4, 5, 6, 7, 8, 9, 10, 11, 12, 13, 14, 15, 16, 17, 18, 19, 20, 21, 22, 23, 24, and 25 illustrate cross-sectional views of various intermediary stages of manufacturing a semiconductor package in accordance with some embodiments.

FIGS. 4 through 26 illustrate cross-sectional views of intermediate steps during a process for forming the semiconductor package 250 in accordance with some embodiments. FIG. 4 illustrates a carrier substrate 100 and a release layer 102 formed on the carrier substrate 100. A first package region 600 and a second package region 602 for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 5:
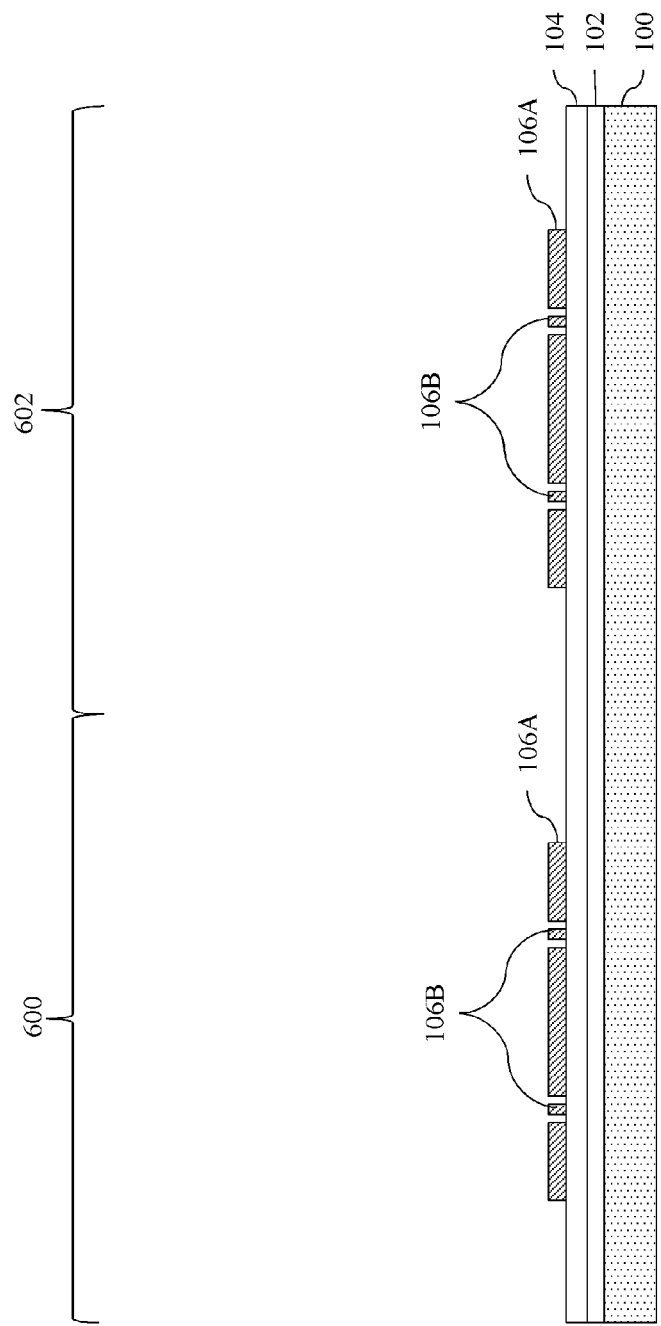

In FIG. 5, a dielectric layer 104 and a metallization pattern (e.g., ground element 106A and feed lines 106B) are formed. As illustrated in FIG. 2, a dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like. The dielectric layer 104 may be formed by any acceptable deposition process, such as spin coating, chemical vapor deposition (CVD), laminating, the like, or a combination thereof. The dielectric layer 104 may be formed to provide a substantially planar top surface for forming subsequent features.

The metallization pattern may include a ground element 106A and feed lines 106B, e.g., as illustrated in FIGS. 1A, 1B, and 1C. As an example to form the ground element 106A and the feed line 106B, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the ground element 106A and the feed line 106B. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the ground element 106A and the feed line 106B.

The dielectric layer 104 and the metallization patterns formed thereon (e.g., the ground element 106A and the feed line 106B) may be referred to as a back-side metallization structure. As illustrated, the back-side metallization structure includes the one dielectric layers 104 and one metallization pattern (the ground element 106A and the feed line 106B). In other embodiments, the back-side redistribution structure can include any number of dielectric layers, metallization patterns, and vias. For example, the back-side redistribution may include two metallization patterns formed in two dielectric layers when the feed line 106B and the ground element 106A are disposed in different layers (e.g., as illustrated by FIGS. 3A, 3B, and 3C). In such embodiments, the ground element 106A may be formed over or under the feed line 106B. One or more additional metallization patterns and dielectric layers may be formed in the back-side metallization structure by repeating the processes for forming the dielectric layer 104, the feed line 106B, and the ground element 106A. Vias may be formed during the formation of a metallization pattern by forming the seed layer and conductive material of the metallization pattern in the opening of the underlying dielectric layer. The vias may therefore interconnect and electrically couple the various metallization patterns (e.g., the feed lines 106B and the ground element 106A in FIG. 3A).

Figure 6:
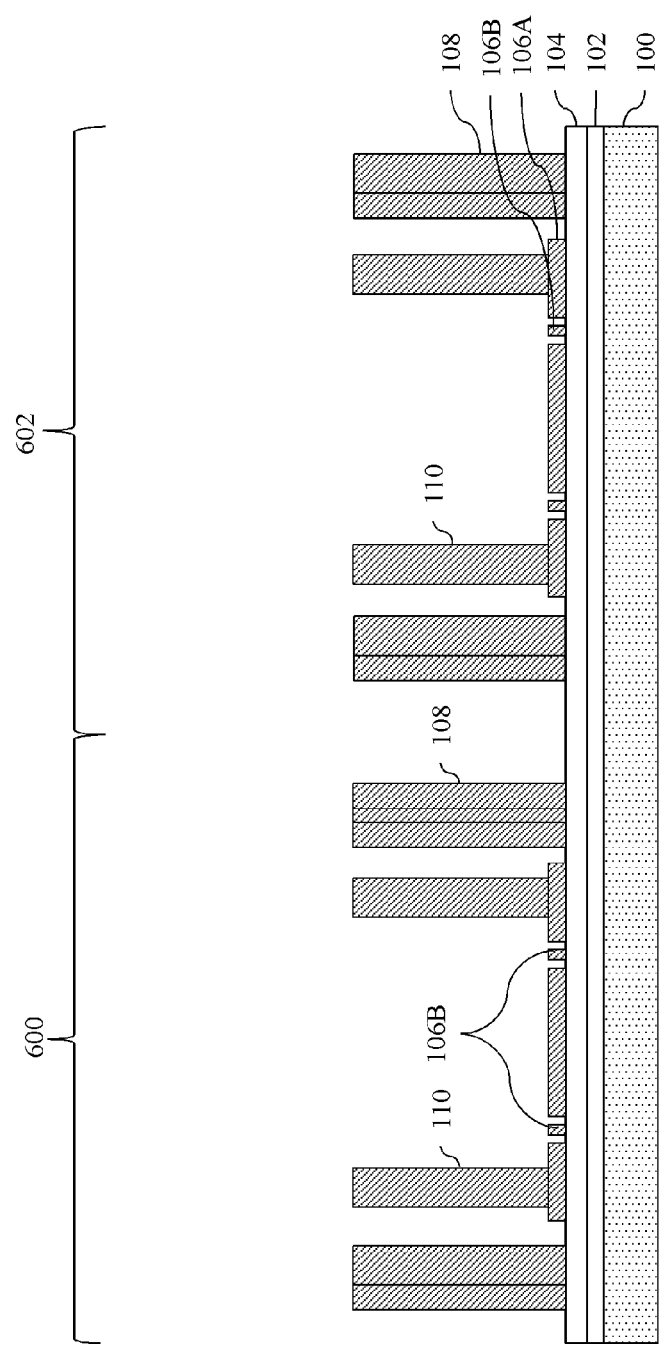

Next in FIG. 6, through vias 110 and (optionally) radiating antennas 108 are formed. As an example to form the through vias 110 and the radiating antennas 108, a seed layer is formed over the back-side redistribution structure, e.g., the dielectric layer 104, the ground element 106A, and the feed lines 106B as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed.

The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the through vias 110 and (optionally) the radiating antennas 108. As illustrated, the through vias 110 may be formed directly on portions of the ground elements 106A and the feed lines 106B. In some embodiments, the through vias 110 and the radiating antennas 108 are formed simultaneously. In other embodiments, the through vias 110 may be formed before or after the radiating antennas 108.

Figure 7:
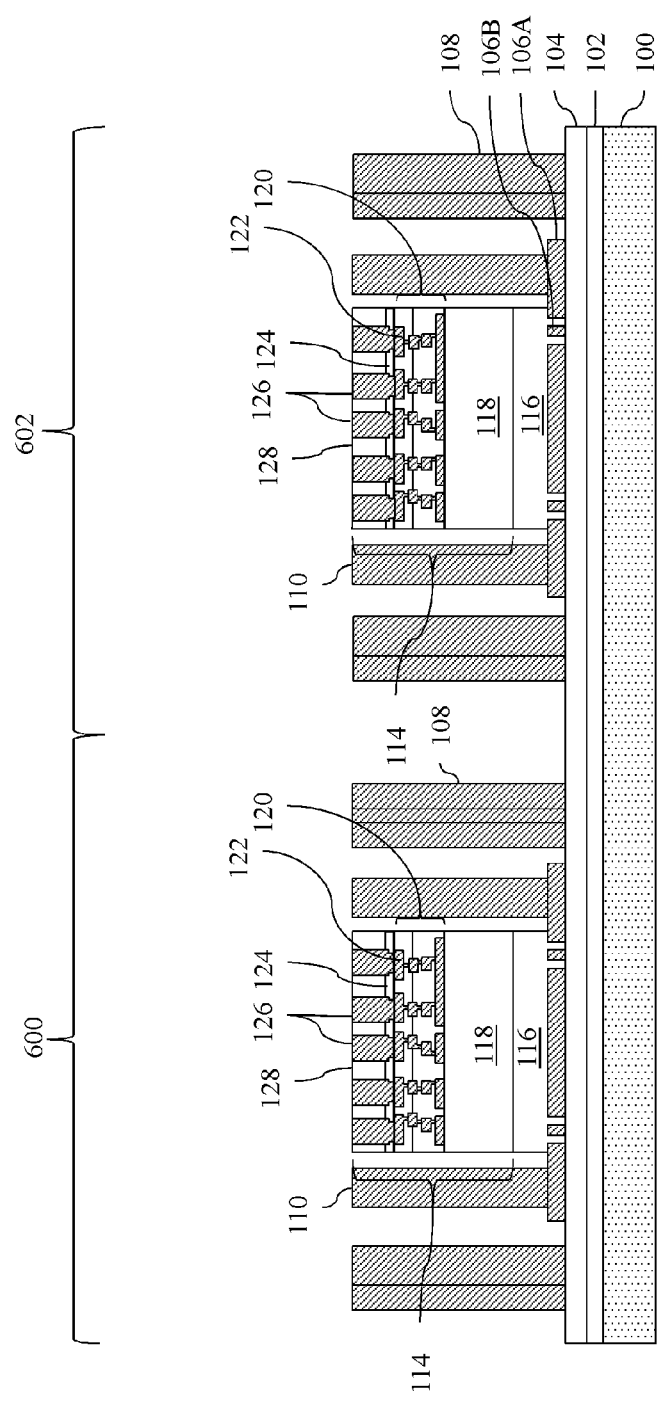

In FIG. 7, integrated circuit dies 114 are adhered to the back-side redistribution structure (e.g., ground element 106B/feed lines 106A) by a dielectric feature 116. As illustrated in FIG. 7, one integrated circuit die 114 is adhered in each of the first package region 600 and the second package region 602, and in other embodiments, more or less integrated circuit dies 114 may be adhered in each region. The integrated circuit dies 114 may be RF dies, baseband dies, logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 104, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Optional die connectors 126, such as conductive pillars (for example, comprising a metal such as copper), are in the openings through the passivation films 124 and are mechanically and electrically coupled to the respective pads 122. The die connectors 126 may be formed by, for example, plating, or the like. The die connectors 126 electrically couple the respective integrated circuits of the integrate circuit dies 114.

An optional dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

In other embodiments, the die connectors 126 and the dielectric material 128 may be excluded, and a subsequently formed redistribution structure may be formed directly on the passivation films 124 and the pads 122. For example, in such embodiments, the completed redistribution structure 170 (see FIG. 21) may be formed directly on the passivation films 124 and the pads 122 such that redistribution lines 138 (see FIG. 21) in the redistribution structure 170 contact the pads 122.

The dielectric features 116 is on back-sides of the integrated circuit dies 114 and adheres the integrated circuit dies 114 to the back-side redistribution structure, such as the dielectric layer 106 in the illustration. The dielectric features 116 may comprise one or more layers of any suitable material, such as a DAF, a low-k material, a PP material, a LC tape, or the like. As discussed above with respect to FIGS. 1A, 1B, and 1C, a thickness of the dielectric features 116 may be selected to improve isolation between the integrated circuit dies 114 and patch antennas comprising the ground elements 106A and the feed lines 106B (e.g., the patch antenna 210 of FIGS. 1A and 1C). Contrary to conventional desires to make various layers of a semiconductor package as thin as possible, a thickness of the dielectric features 116 may be increased to improve isolation between the ground elements 106A/feed liens 106B and the integrated circuit die 114. In various embodiments, the thickness of the dielectric features 116 may be selected in accordance with an operating bandwidth (e.g., frequency) of the patch antenna, a desired efficiency of the patch antenna, a k-value of the dielectric features 116, and area of the ground elements 106A in a top down view, combinations thereof, and the like. For example, the dielectric features 116 may have any of the thicknesses d corresponding to k-values and/or operating bandwidths discussed above with respect to FIGS. 1A, 1B, and 1C. The thicknesses d may also correspond to a distance between the integrated circuit dies 114 and the ground elements 106A/feed lines 106B.

Furthermore, although the dielectric features 116 are illustrates as being a single layer having a same width as a respective integrated circuit die 114, the dielectric features 116 may comprise multiple layers of different dielectric materials and/or may be wider than or narrower than the integrated circuit dies 114 (e.g., as described above with respect to FIGS. 2A, 2B, 2C, 2D, and 2E). The dielectric features 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the ground elements 106A/feed liens 106B by the dielectric features 116 using, for example, a pick-and-place tool. Furthermore, the dielectric features 116 may fill a space between the ground elements 106A and the feed lines 106B after the integrated circuit dies 114 are attached. For example, the dielectric features 116 may extend through openings in the ground elements 106A to the dielectric layer 104.

Figure 8:
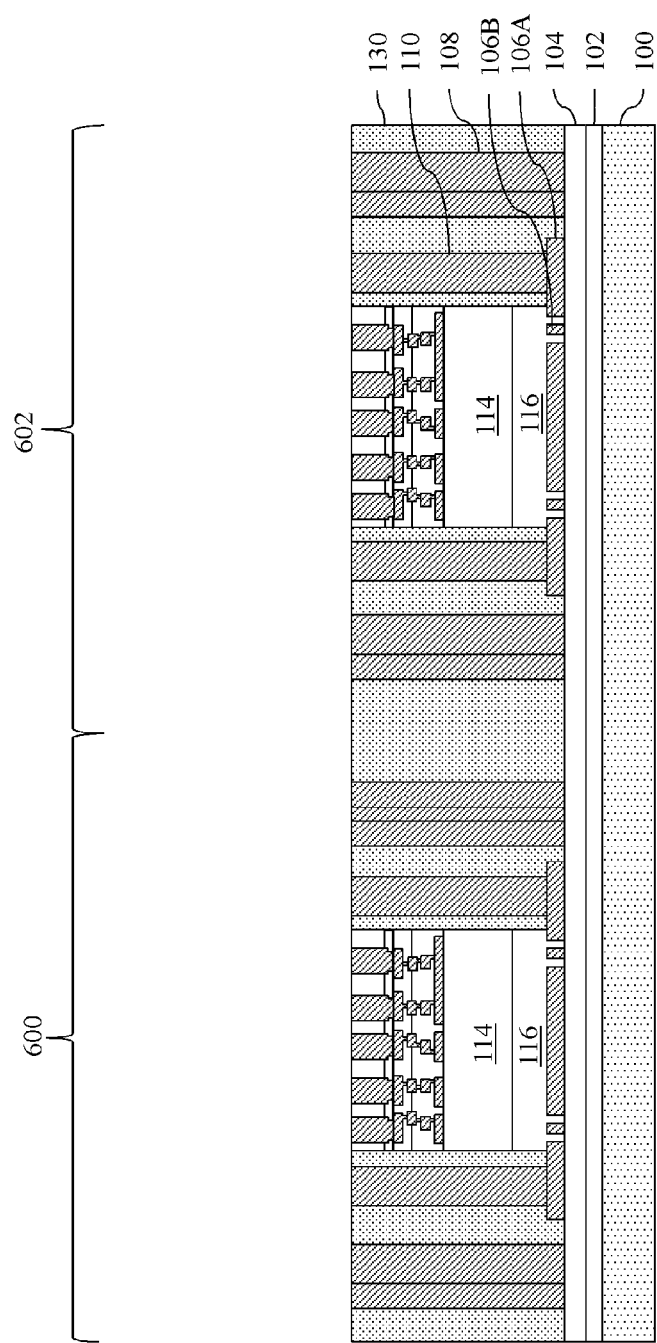

In FIG. 8, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 110, radiating antennas 108, and die connectors 126. Top surfaces of the through vias 110, radiating antennas 108, die connectors 126, and encapsulant 130 are coplanar after the grinding process. In some embodiments, the grinding may be omitted, for example, if through vias 110, radiating antennas 108, and die connectors 126 are already exposed.

In FIGS. 9 through 18, a front-side redistribution structure 170 (see FIG. 18) is formed. As will be illustrated in FIG. 18, the front-side redistribution structure 170 includes dielectric layers 132, 140, 148, and 156 and metallization patterns 138, 146, and 154 (sometimes referred to as redistribution layers 138, 146, and 154 or redistribution lines 138, 146, and 154).

Figure 9:
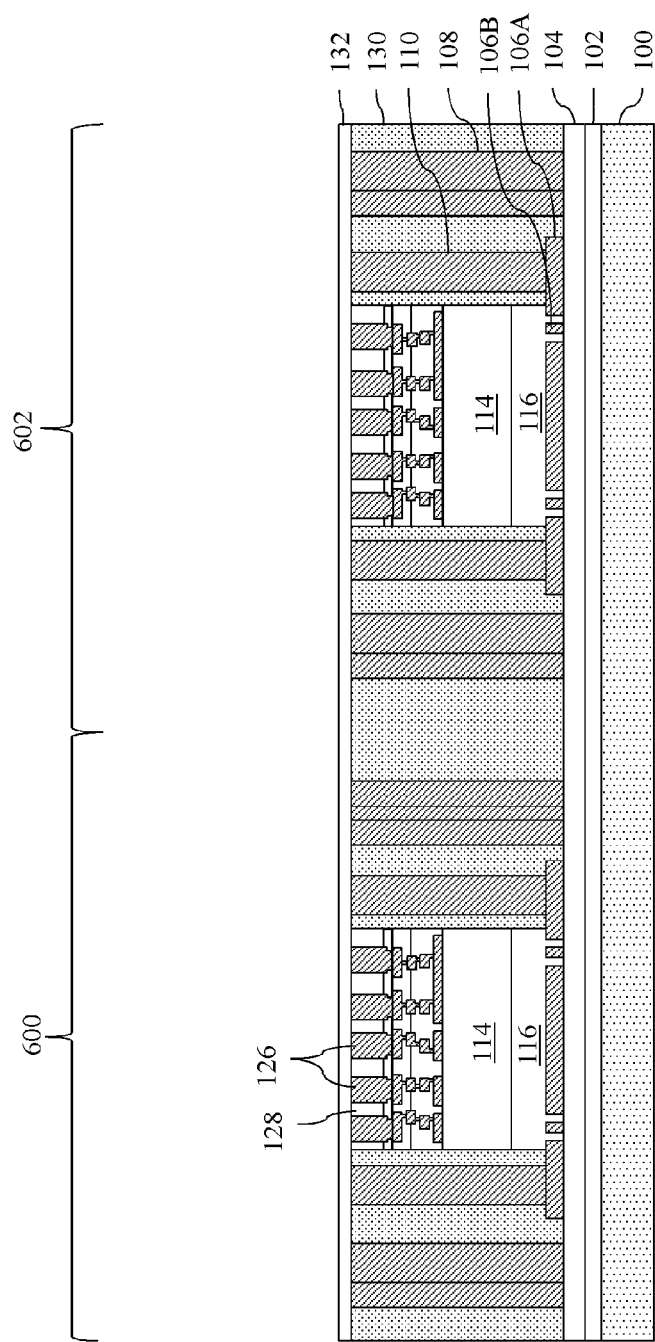

In FIG. 9, the dielectric layer 132 is deposited on the encapsulant 130, through vias 110, radiating antennas 108, and die connectors 126. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. The dielectric layer 132 may be formed by spin coating, lamination, CVD, the like, or a combination thereof.

Figure 10:
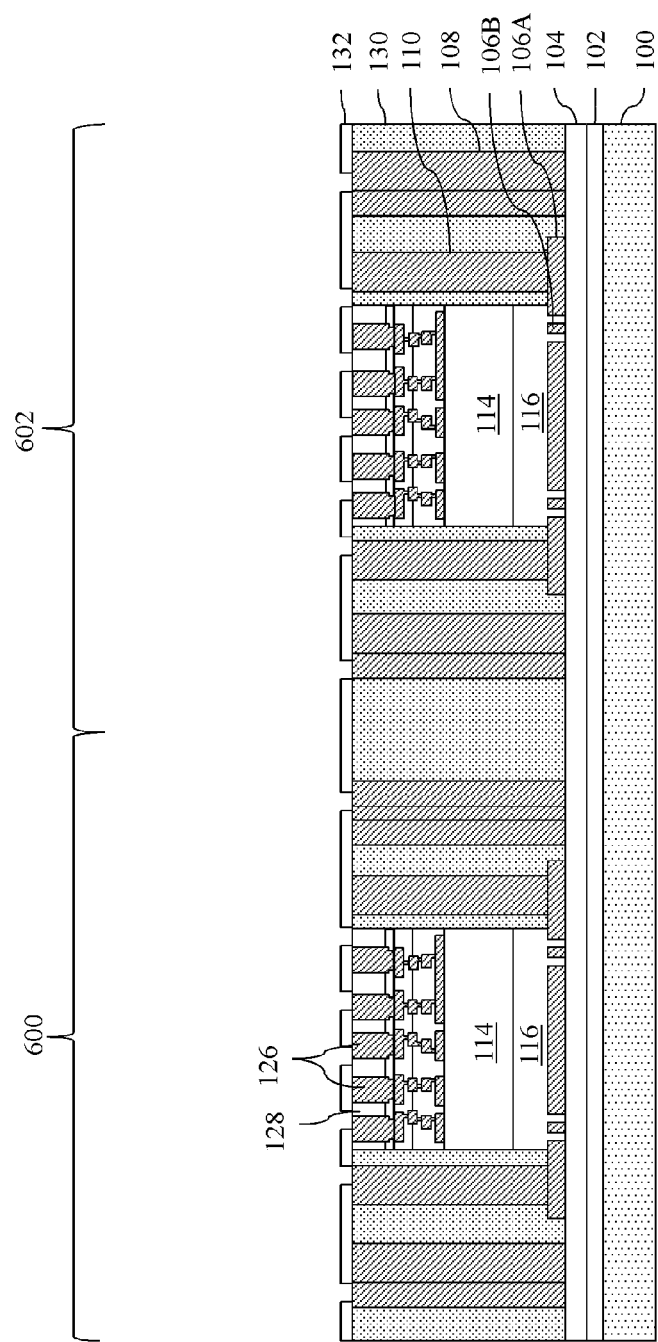

In FIG. 10, the dielectric layer 132 is then patterned. The patterning forms openings to expose portions of the through vias 110, the radiating antennas 108, and the die connectors 126. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure.

Figure 11:
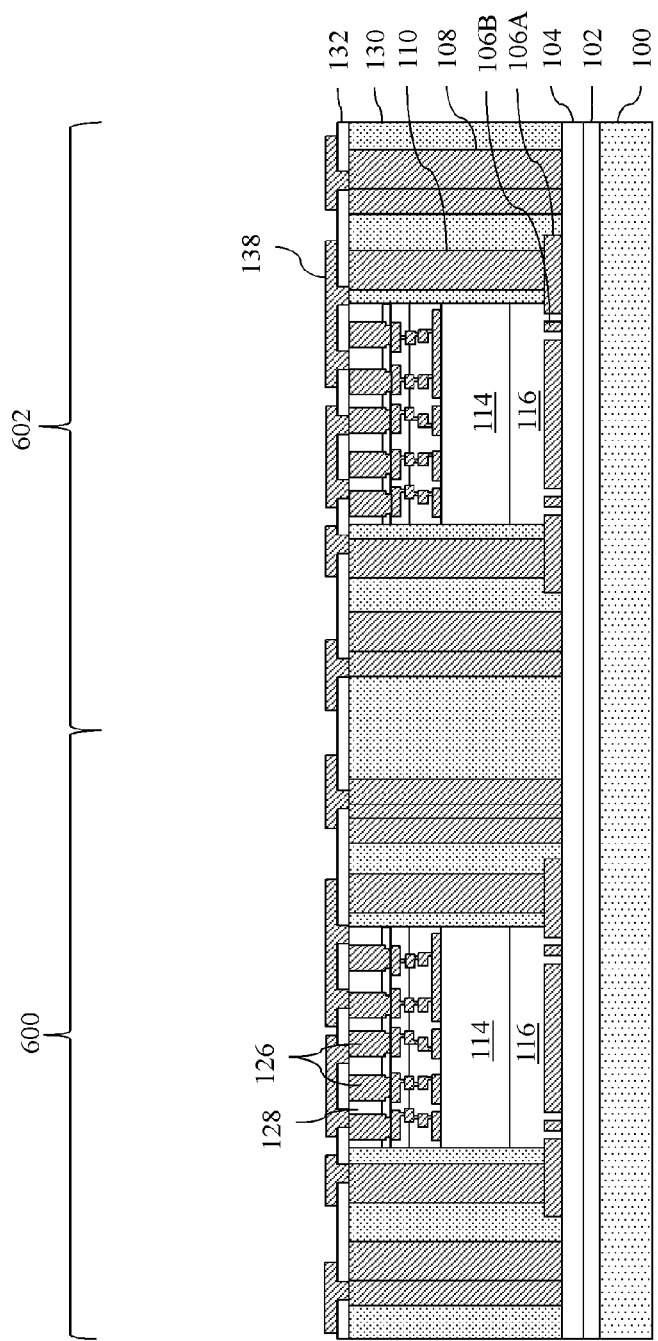

In FIG. 11, metallization pattern 138 with vias is formed on the dielectric layer 132. As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 110, the radiating antennas 108, and/or the die connectors 126.

Figure 12:
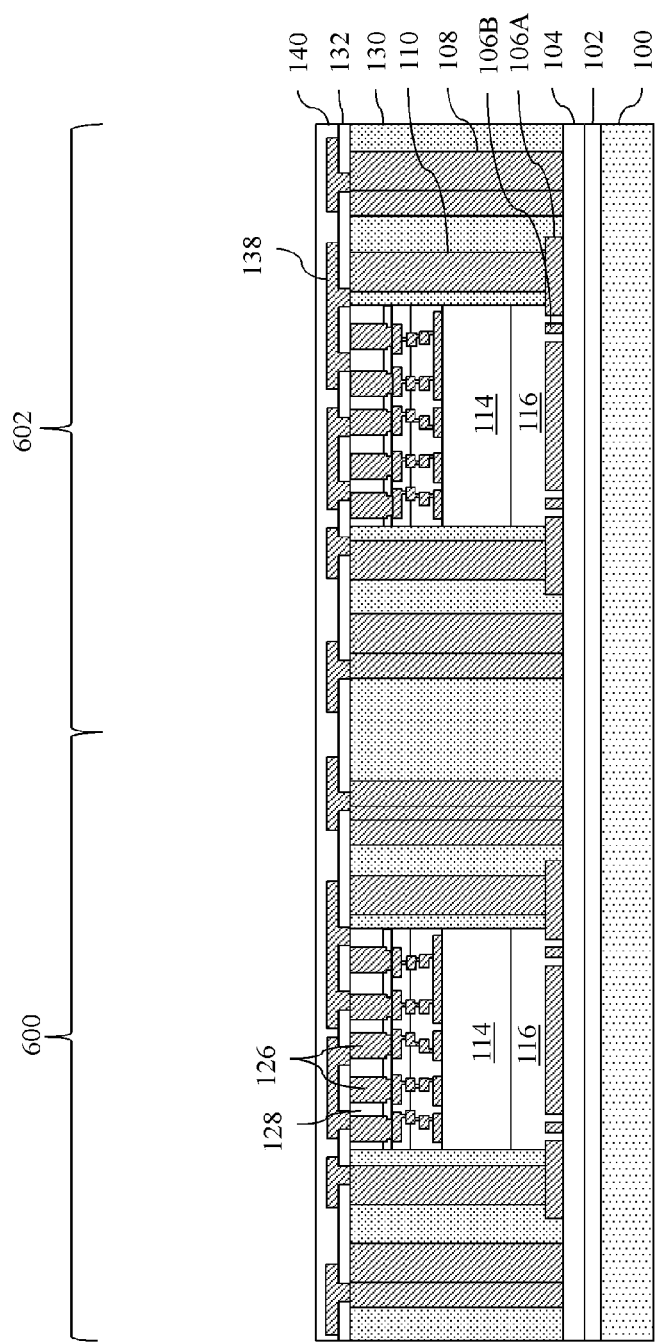

In FIG. 12, the dielectric layer 140 is deposited on the metallization pattern 138 and the dielectric layer 132. In some embodiments, the dielectric layer 140 is formed of a polymer, which may be a photo-sensitive material such as PBO, polyimide, BCB, or the like, that may be patterned using a lithography mask. In other embodiments, the dielectric layer 140 is formed of a nitride such as silicon nitride; an oxide such as silicon oxide, PSG, BSG, BPSG; or the like. The dielectric layer 140 may be formed by spin coating, lamination, CVD, the like, or a combination thereof.

Figure 13:
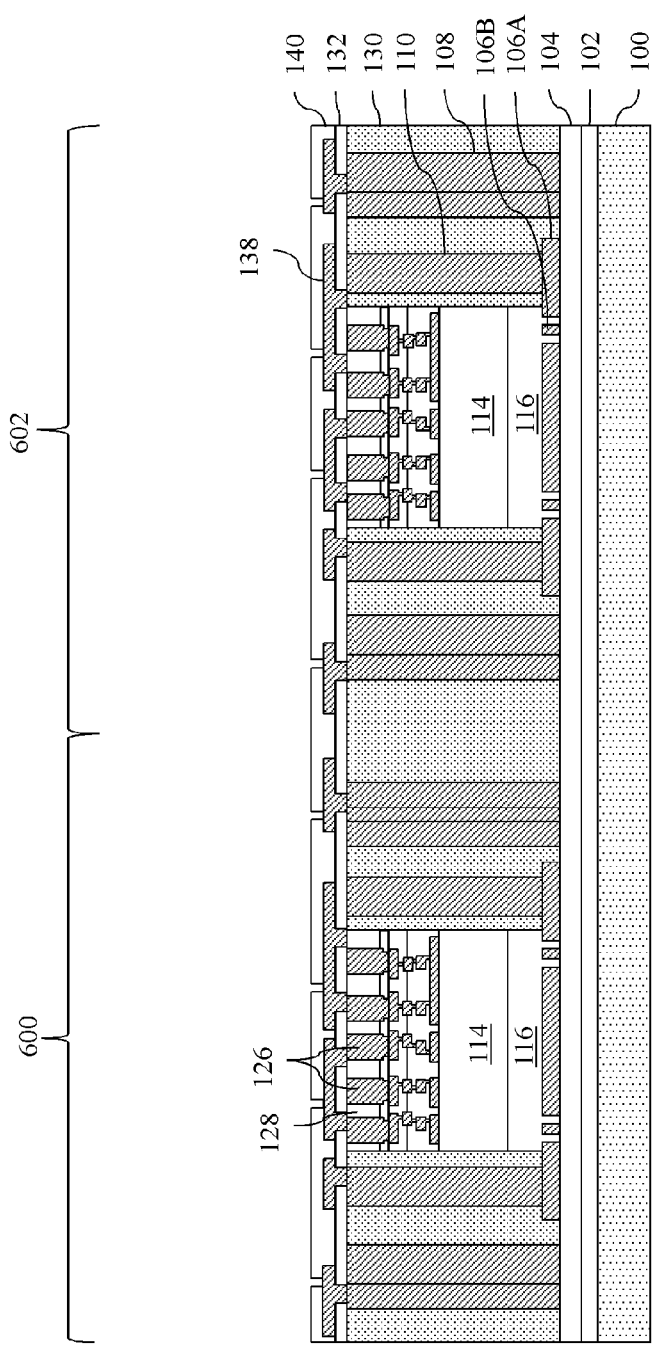

In FIG. 13, the dielectric layer 140 is then patterned. The patterning forms openings to expose portions of the metallization pattern 138. The patterning may be by an acceptable process, such as by exposing the dielectric layer 140 to light when the dielectric layer is a photo-sensitive material or by etching using, for example, an anisotropic etch. If the dielectric layer 140 is a photo-sensitive material, the dielectric layer 140 can be developed after the exposure.

Figure 14:
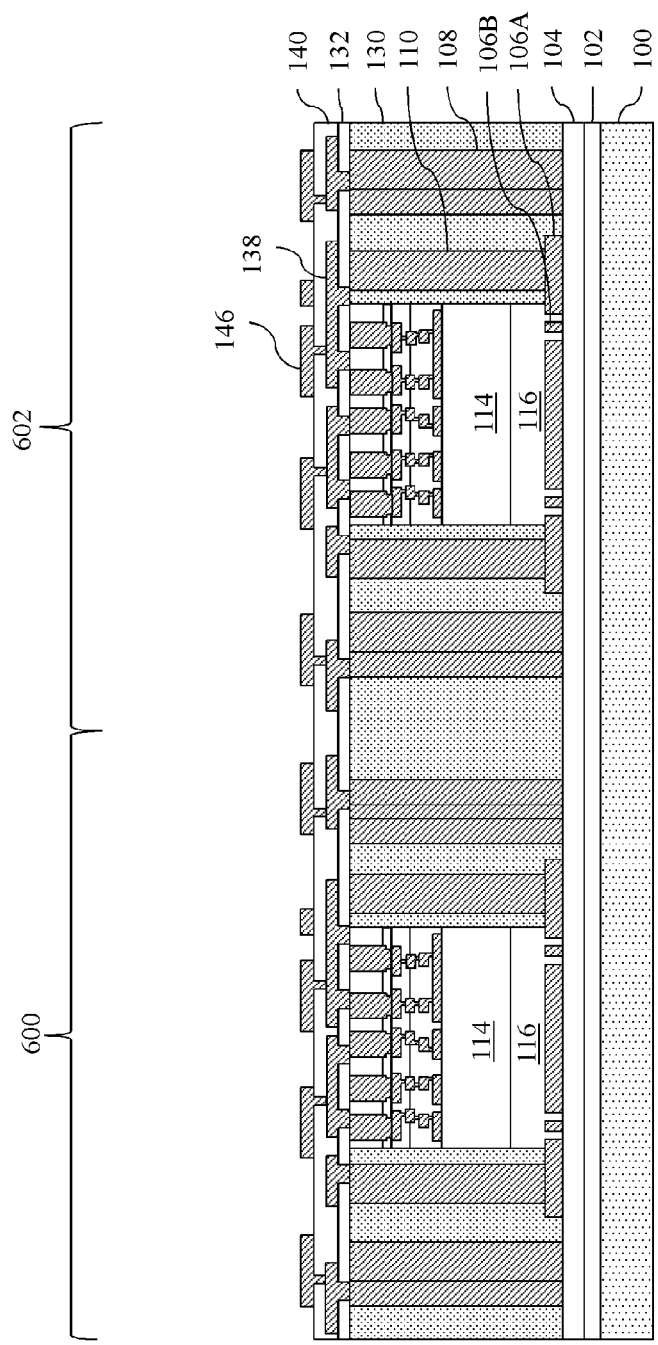

In FIG. 14, metallization pattern 146 with vias is formed on the dielectric layer 140. As an example to form metallization pattern 146, a seed layer (not shown) is formed over the dielectric layer 140 and in openings through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 146. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 146 and vias. The vias are formed in openings through the dielectric layer 140 to, e.g., portions of the metallization pattern 138.

Figure 15:
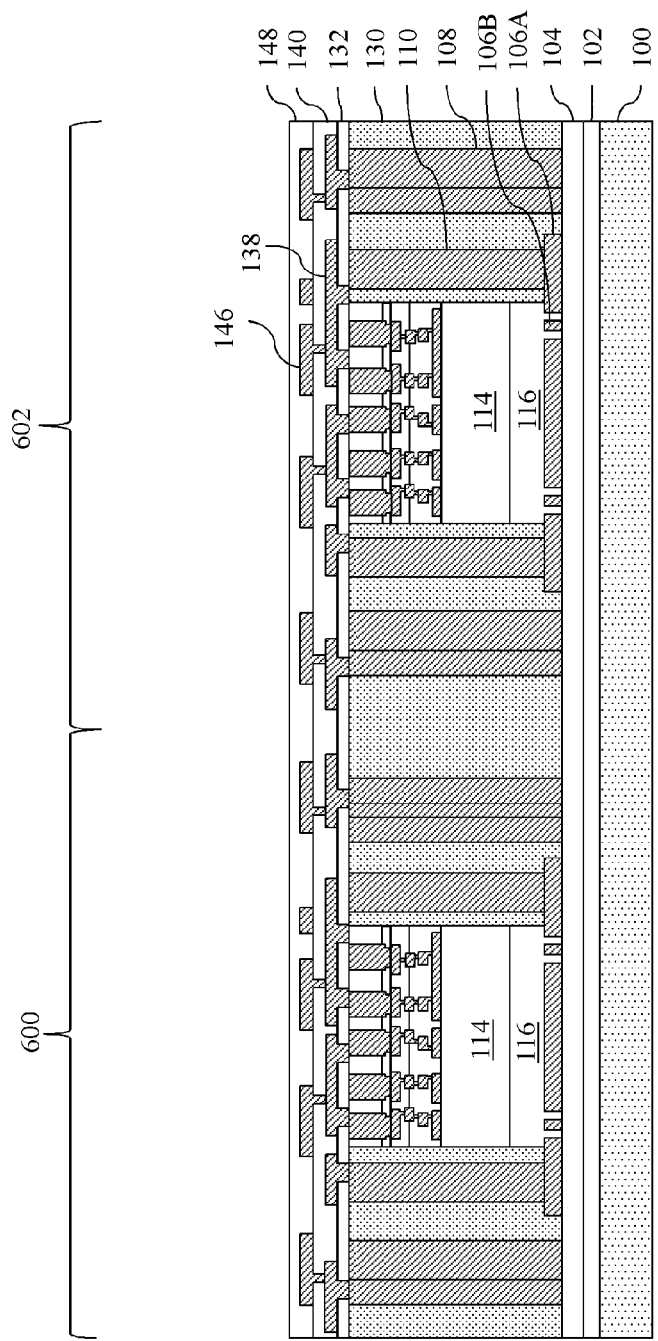

In FIG. 15, the dielectric layer 148 is deposited on the metallization pattern 146 and the dielectric layer 140. In some embodiments, the dielectric layer 148 is formed of a polymer, which may be a photo-sensitive material such as PBO, polyimide, BCB, or the like, that may be patterned using a lithography mask. In other embodiments, the dielectric layer 148 is formed of a nitride such as silicon nitride; an oxide such as silicon oxide, PSG, BPS G; or the like. The dielectric layer 148 may be formed by spin coating, lamination, CVD, the like, or a combination thereof.

Figure 16:
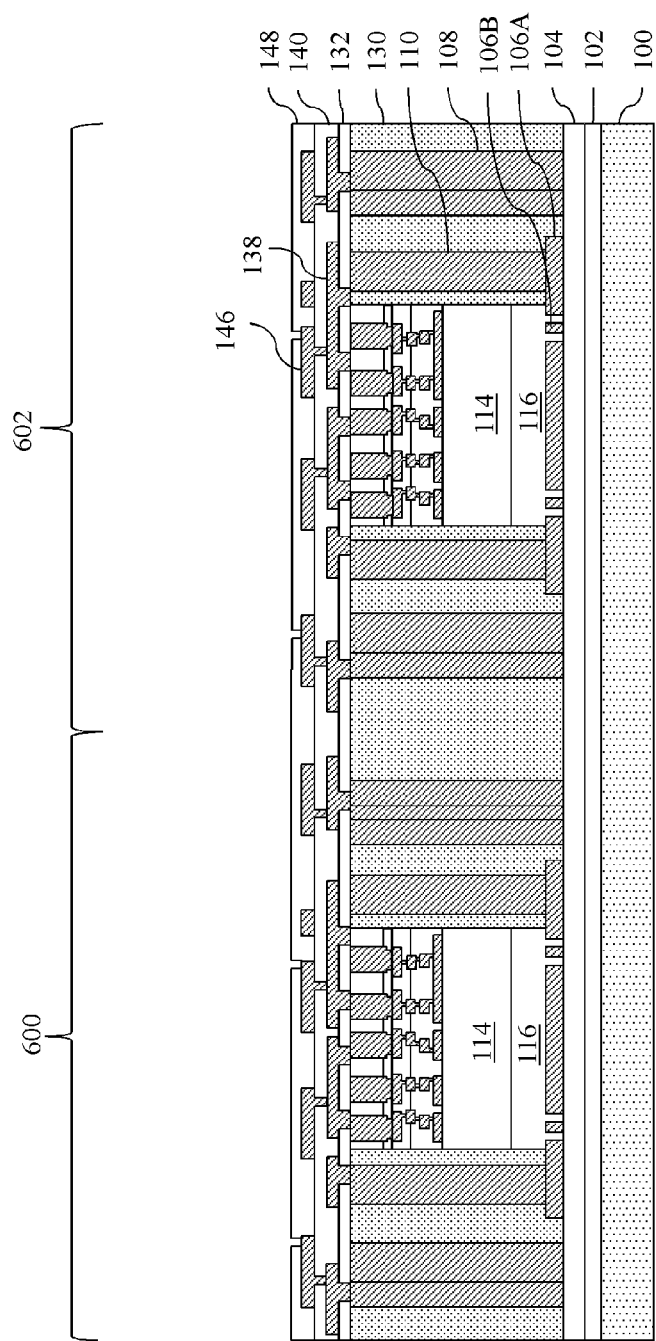

In FIG. 16, the dielectric layer 148 is then patterned. The patterning forms openings to expose portions of the metallization pattern 146. The patterning may be by an acceptable process, such as by exposing the dielectric layer 148 to light when the dielectric layer is a photo-sensitive material or by etching using, for example, an anisotropic etch. If the dielectric layer 148 is a photo-sensitive material, the dielectric layer 148 can be developed after the exposure.

Figure 17:
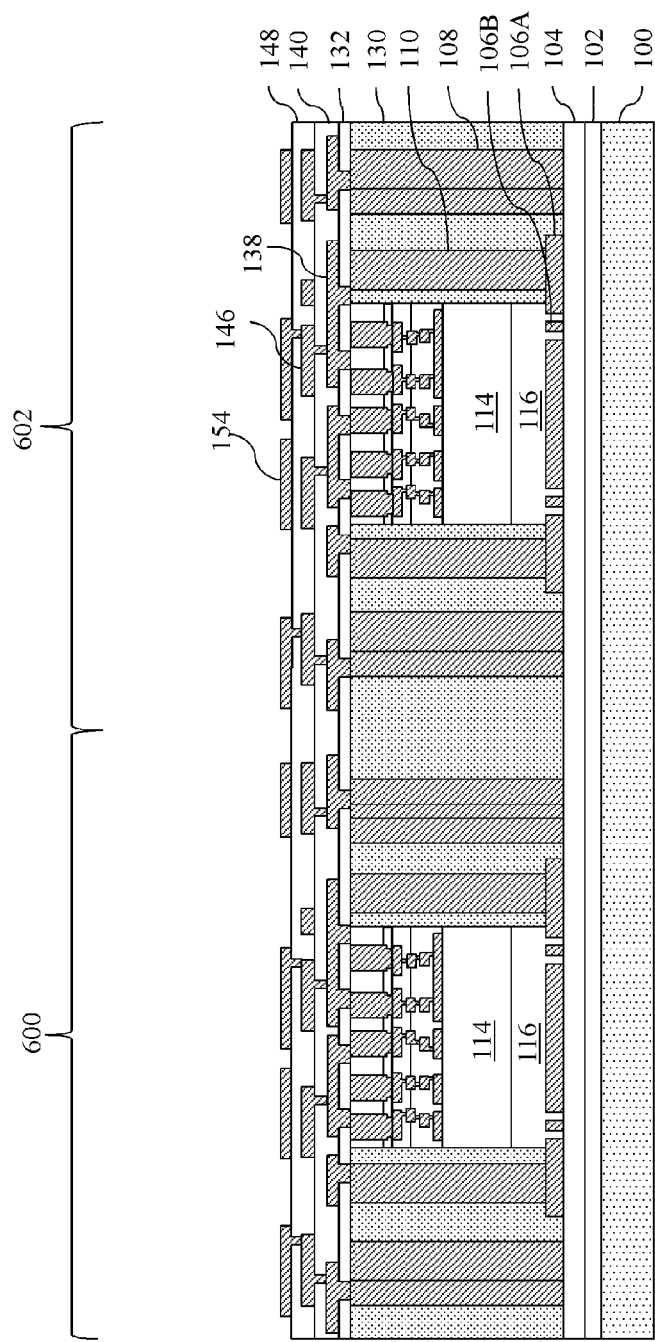

In FIG. 17, metallization pattern 154 with vias is formed on the dielectric layer 148. As an example to form metallization pattern 154, a seed layer (not shown) is formed over the dielectric layer 148 and in openings through the dielectric layer 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 154. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 154 and vias. The vias are formed in openings through the dielectric layer 148 to, e.g., portions of the metallization pattern 146.

Figure 18:
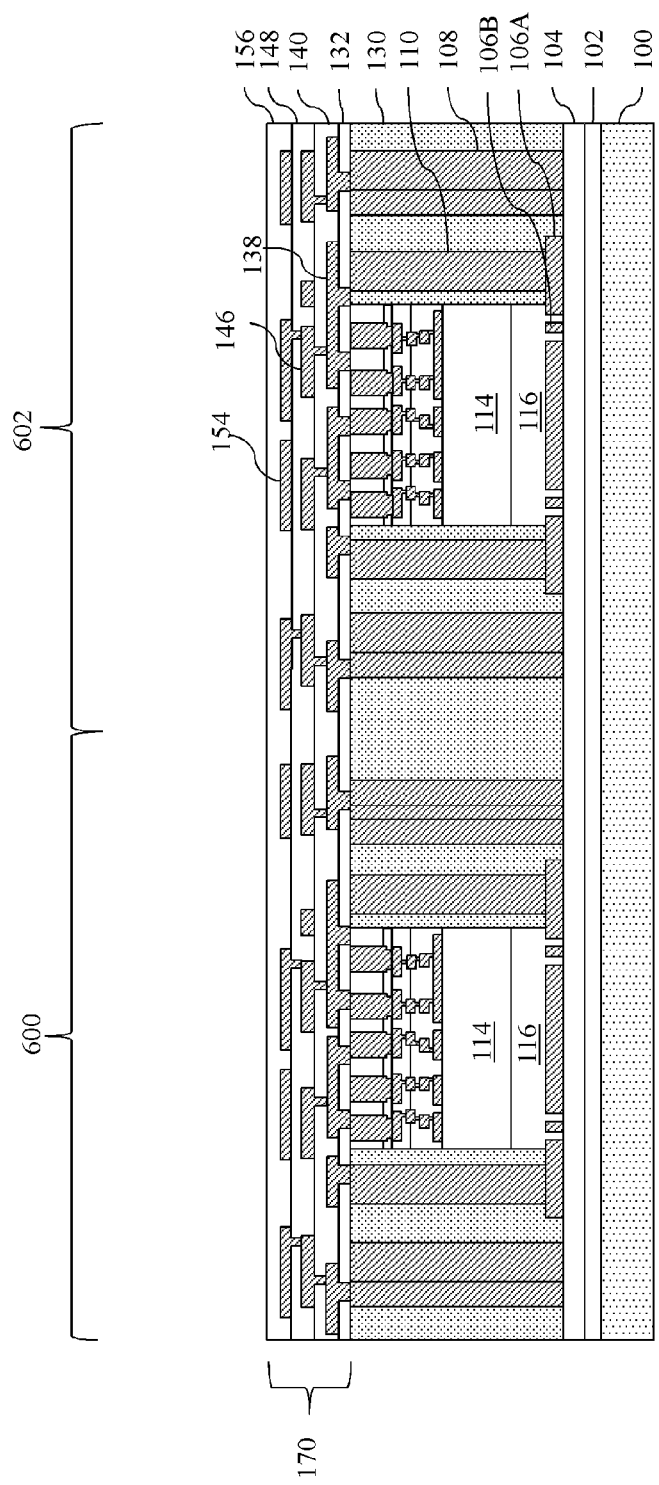

In FIG. 18, the dielectric layer 156 is deposited on the metallization pattern 154 and the dielectric layer 148. In some embodiments, the dielectric layer 156 is formed of a polymer, which may be a photo-sensitive material such as PBO, polyimide, BCB, or the like, that may be patterned using a lithography mask. In other embodiments, the dielectric layer 156 is formed of a nitride such as silicon nitride; an oxide such as silicon oxide, PSG, BSG, BPSG; or the like. The dielectric layer 156 may be formed by spin coating, lamination, CVD, the like, or a combination thereof.

The front-side redistribution structure 170 is shown as an example. More or fewer dielectric layers and metallization patterns may be formed in the front-side redistribution structure 170. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 19:
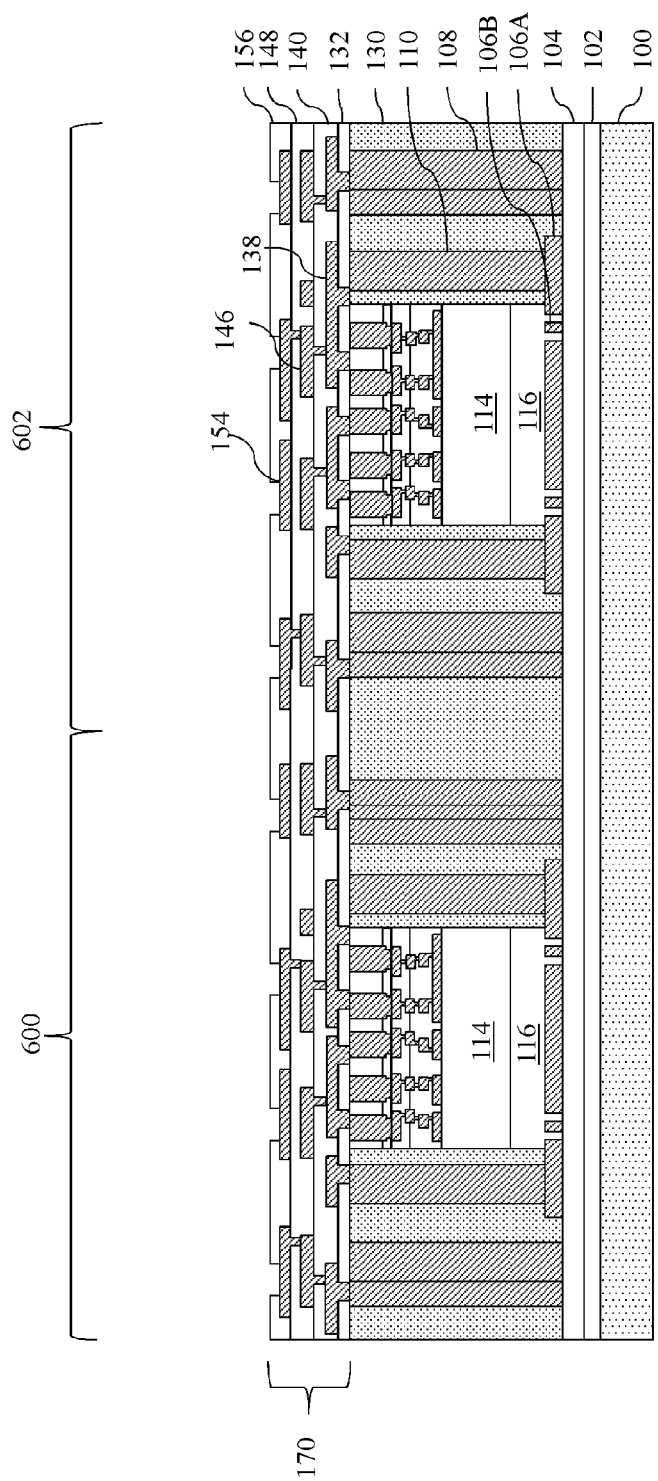

In FIG. 19, the dielectric layer 156 is then patterned. The patterning forms openings to expose portions of the metallization pattern 154. The patterning may be by an acceptable process, such as by exposing the dielectric layer 156 to light when the dielectric layer is a photo-sensitive material or by etching using, for example, an anisotropic etch. If the dielectric layer 156 is a photo-sensitive material, the dielectric layer 156 can be developed after the exposure.

Figure 20:
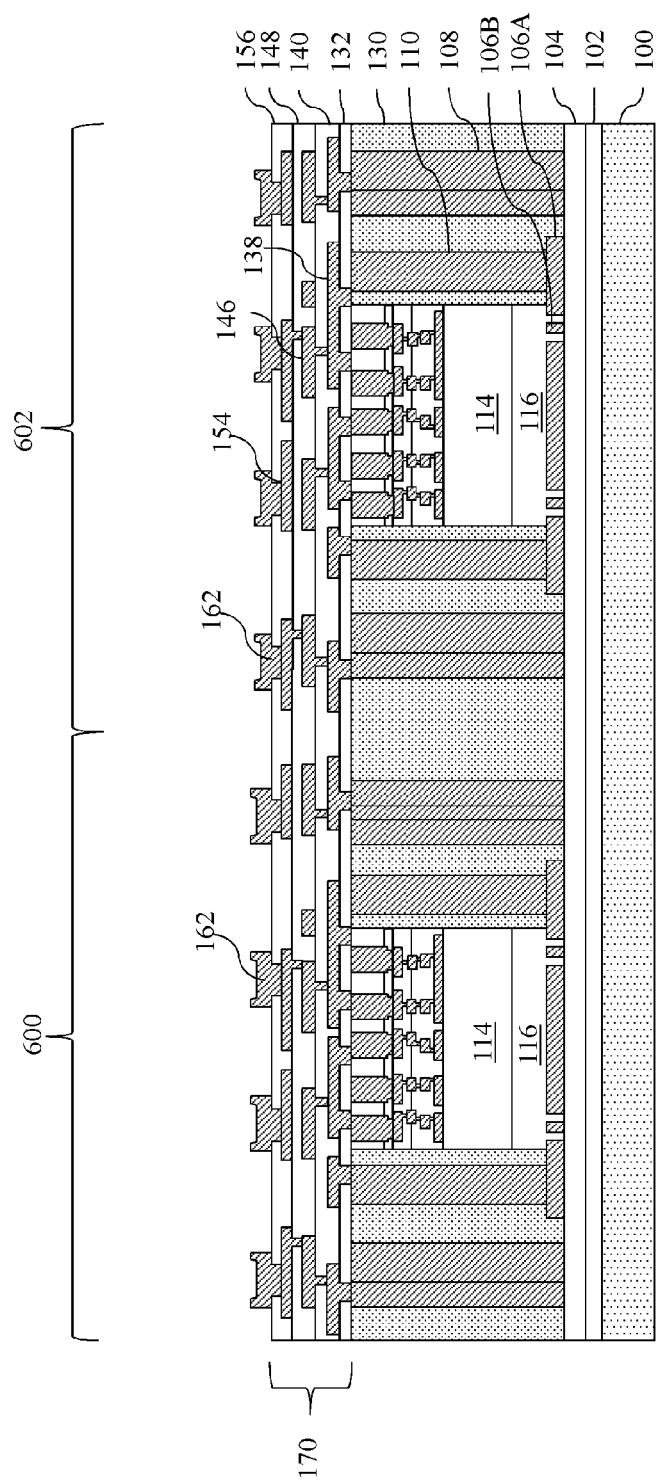

In FIG. 20, pads 162 are formed on an exterior side of the front-side redistribution structure 160. The pads 162 are used to couple to conductive connectors 166 (see FIG. 21) and may be referred to as under bump metallurgies (UBMs) 162. In the illustrated embodiment, the pads 162 are formed through openings through the dielectric layer 156 to the metallization pattern 154. As an example to form the pads 162, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162. In the embodiment, where the pads 162 are formed differently, more photo resist and patterning steps may be utilized.

Figure 21:
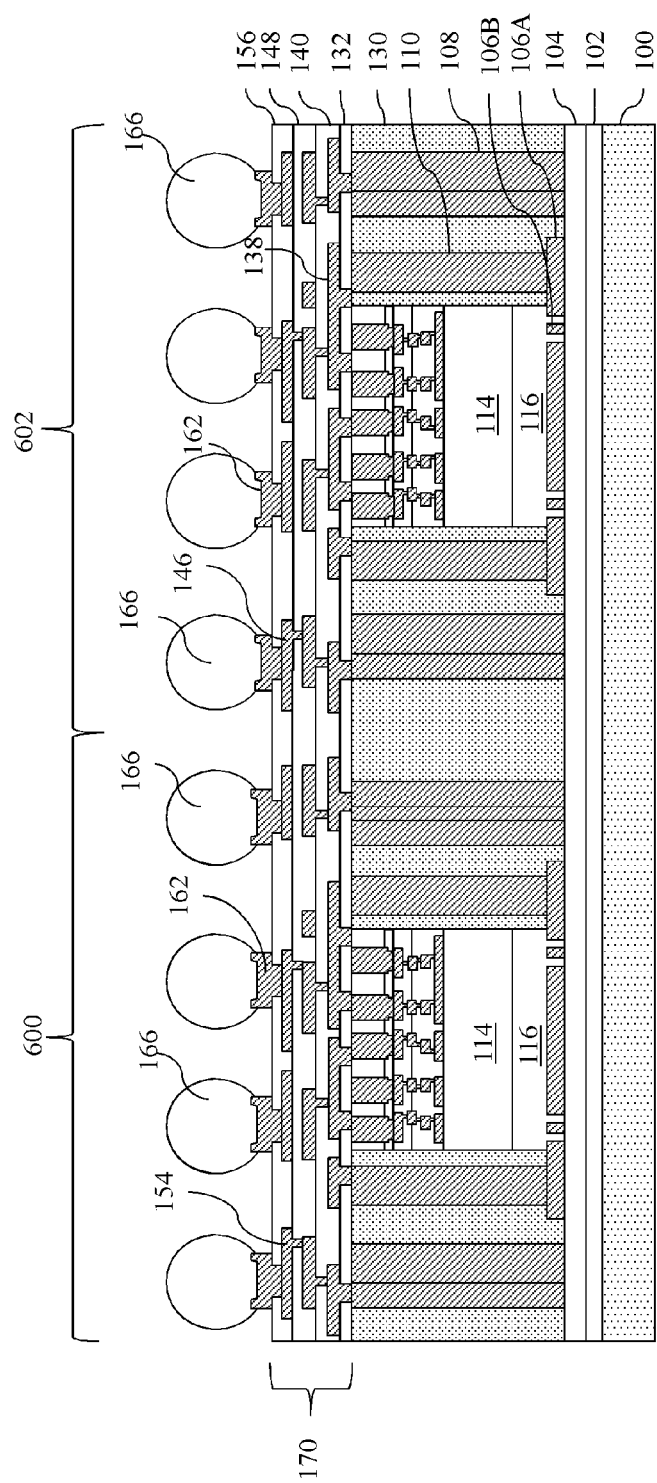

In FIG. 21, conductive connectors 166 are formed on the UBMs 162. The conductive connectors 166 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 166. The metal cap layer may include nickel, tin, tin-lead, gold, silver, palladium, indium, nickel-palladium-gold, nickel-gold, the like, or a combination thereof and may be formed by a plating process.

Figure 22:
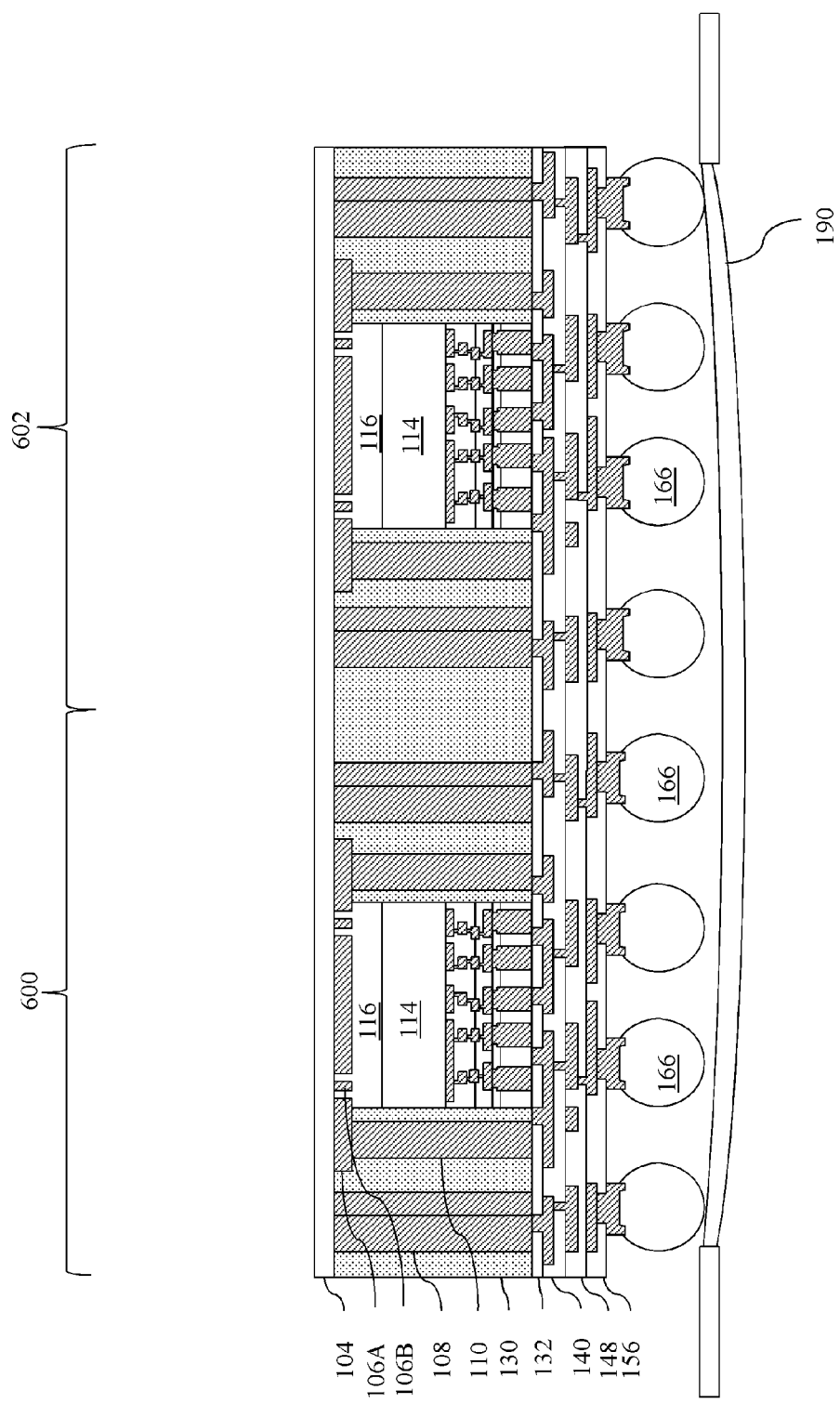

In FIG. 22, a carrier substrate de-bonding is performed to detach (de-bond) the carrier substrate 100 from the backside redistribution structure, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 190.

Figure 23:
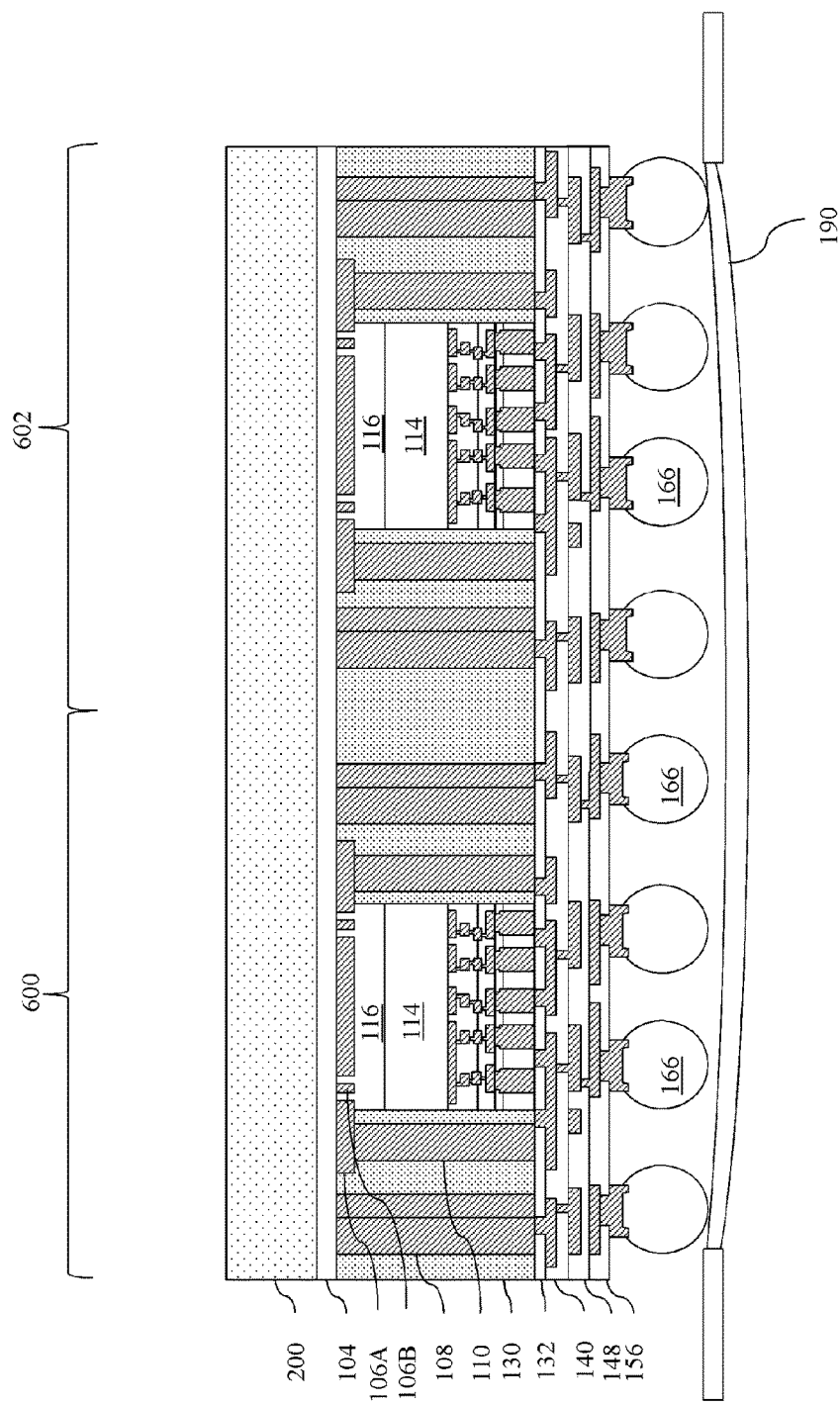

In FIG. 23, a dielectric layer 200 is formed over dielectric layer 104. In some embodiments, the dielectric layer 200 comprises a relatively low DF material in order to achieve a suitably efficient patch antenna. For example, a DF of the dielectric layer 200 may be less than about 0.01 or even less than about 0.001 in some embodiments. Furthermore, a k-value of the dielectric layer 200 may be about 3 to about 4. In an embodiment, the thickness of the dielectric layer 200 is related to the operating frequency of the patch antenna 210. For example, the thickness of the dielectric layer 200 may be inversely proportional to an operating frequency of the patch antenna 210. In an embodiment, a thickness of the dielectric layer 200 may be in the range of about 200 μm to about 300 μm when the patch antenna 210 has an operating frequency of at least 60 GHz. The dielectric layer 200 may be formed using any suitable process, such as, lamination. Other deposition processes (e.g., PVD, CVD, a spin-on technique, etc.) may also be used in other embodiments.

Figure 24:
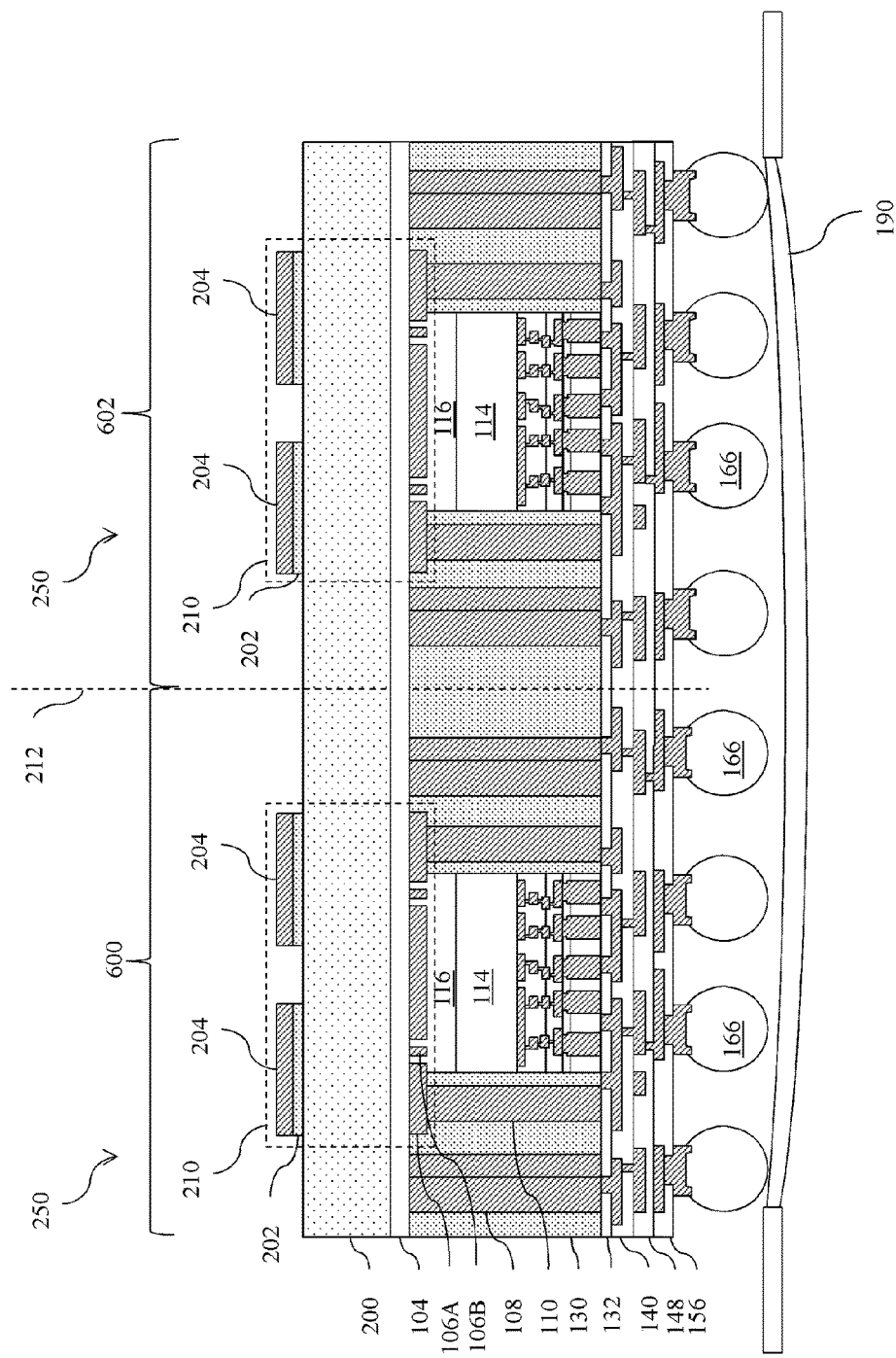

In FIG. 24, radiating elements 204 of a patch antenna are formed over the dielectric layer 200. In a top down view (e.g., see FIG. 1C), the radiating elements 204 may have a rectangular shape and overlap the ground elements 106A/feed lines 106B although other shapes are contemplated in other embodiments. The radiating element 204 may comprise any suitable conductive material, such as, copper, although other conductive materials may be used in other embodiments. Radiating elements 204 may be adhered on a surface of the dielectric layer 200 by an adhesive 202. In some embodiments, the adhesive 202 may be an epoxy, which is applied to the radiating elements 204 prior to adhesion on the dielectric layer 200. The radiating elements 204 may then be placed on the dielectric layer 200 (e.g., by a pick and place tool), and the adhesive 202 may be activated (e.g., by heating) to adhere the radiating elements 204 on the dielectric layer 200. In other embodiments, the adhesive 202 is excluded and the radiating elements 204 are directly adhered to the dielectric layer 200. In other embodiments, the radiating elements 204 are formed on the dielectric layer 200 using a different method, such as, by depositing a seed layer, forming a patterned mask over the seed layer to define a pattern of the radiating elements 204, plating the radiating elements in openings of the patterned mask, and removing the patterned mask and excess portions of the seed layer. Other deposition processes are also possible for the radiating elements 204.

The radiating elements 204 are electrically coupled to the underlying ground element 106A and feed lines 106B for the transmission and reception of wireless signals. Thus, patch antennas 210 (comprising the ground elements 106A, feed lines 106B, portions of the dielectric layer 200, and radiating elements 204) are formed. Each of the patch antennas 210 are integrated in a same semiconductor package as an integrated circuit dies 114 and the optional radiating antennas 108. A dielectric feature 116 physically separates and helps isolate each of the integrated circuit dies 114 from a respective patch antenna 210 in order to increase the efficiency of the patch antenna 210.

After the radiating elements 204 are formed, a singulation process is performed by sawing along scribe line regions 212 e.g., between adjacent regions 600 and 602. The sawing singulates the first package region 600 from the second package region 602 to form a semiconductor package 250.

Figure 25:
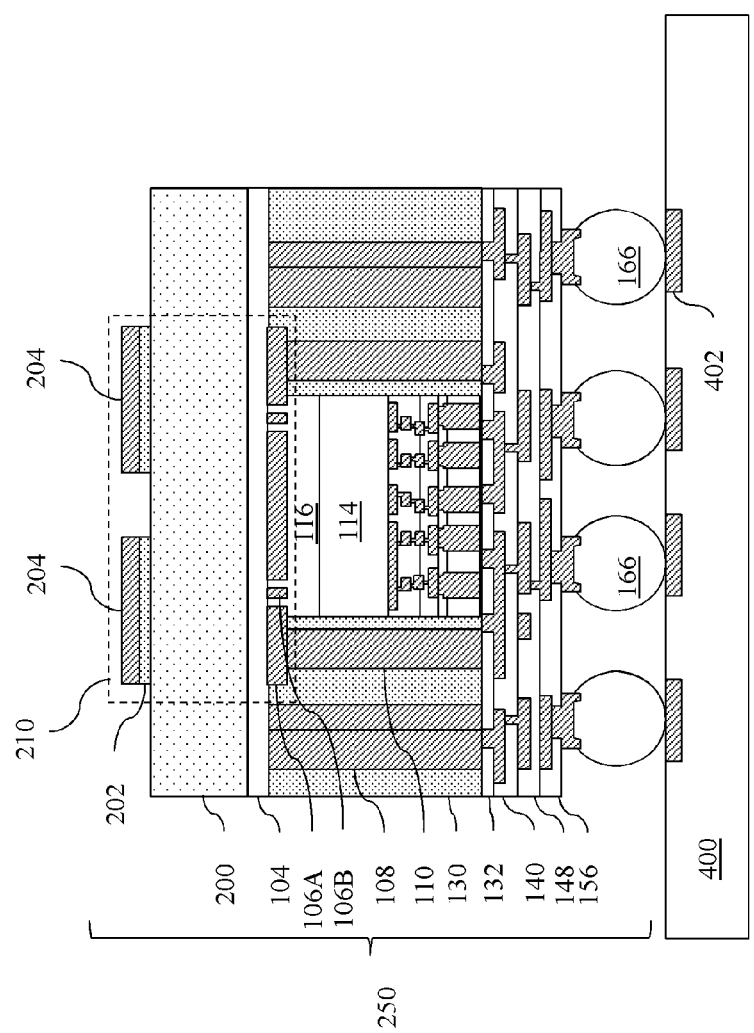

FIG. 25 illustrates the semiconductor package 250 after semiconductor package 250 are mounted to a substrate 400. The substrate 400 may be referred to a package substrate 400. The package 250 is mounted to the package substrate 400 using the conductive connectors 166.

The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown in FIG. 25). As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 166 can be reflowed to attach the package 250 to the bond pads 402. The conductive connectors 166 electrically and/or physically couple the substrate 400, including metallization layers in the substrate 400, to the first package 250. In some embodiments, passive devices (e.g., surface mount devices (SMDs), not illustrated) may be attached to the package 250 (e.g., bonded to the bond pads 402) prior to mounting on the substrate 400. In such embodiments, the passive devices may be bonded to a same surface of the package 250 as the conductive connectors 166.

The conductive connectors 166 may have an epoxy flux (not shown) formed thereon before they are reflowed with at least some of the epoxy portion of the epoxy flux remaining after the package 250 is attached to the substrate 400. This remaining epoxy portion may act as an underfill to reduce stress and protect the joints resulting from the reflowing the conductive connectors 166. In some embodiments, an underfill (not shown) may be formed between the first package 250 and the substrate 400 and surrounding the conductive connectors 166. The underfill may be formed by a capillary flow process after the package 250 is attached or may be formed by a suitable deposition method before the package 250 is attached.

The various above embodiments have been described with respect to a specific context, namely a package including an integrated circuit die 114 and one or more integrated antennas (e.g., the patch antenna 210). A dielectric feature 116 is disposed between the integrated circuit die 114 and a ground feature and/or signal line (referred to as a feed line) of the patch antenna to reduce interference. However, various embodiments may be applied to other types of packages, which may or may not include integrated antennas.

Figure 26A:
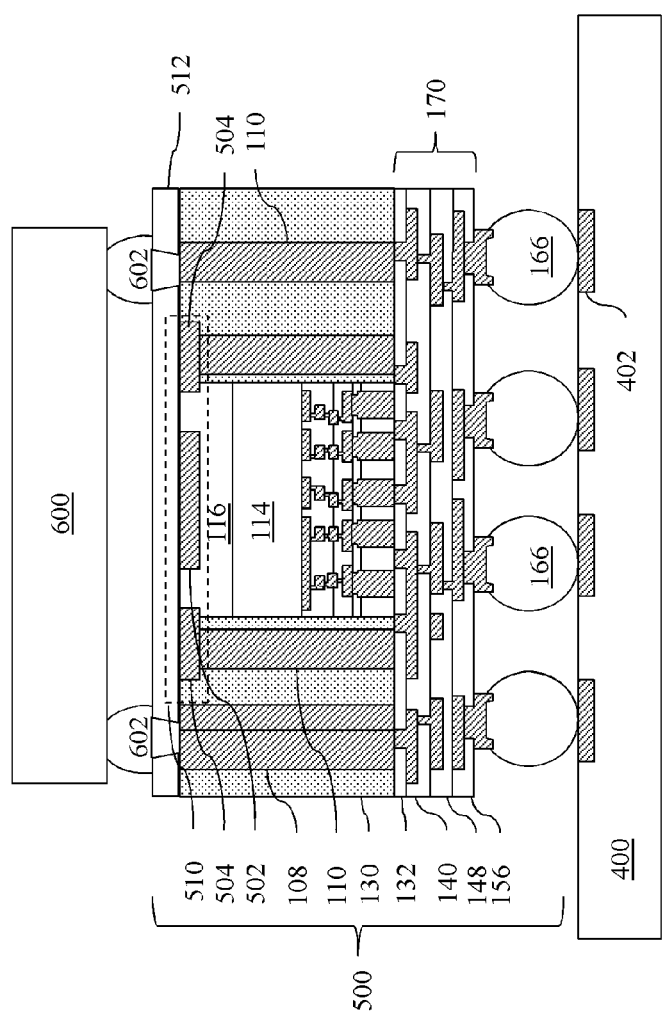
FIGS. 26A and 26B illustrate varying views of a semiconductor package in accordance with some alternative embodiments.
Figure 26B:
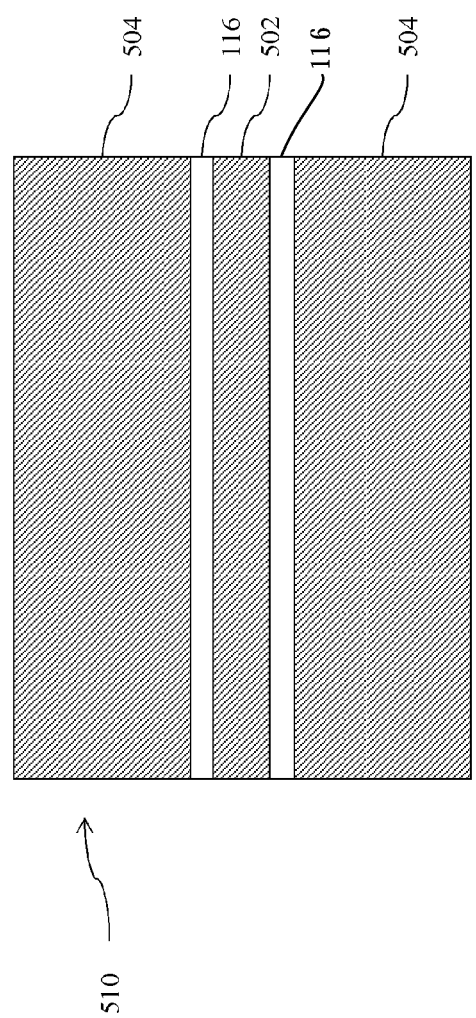

For example, FIGS. 26A and 26B illustrate varying views of a semiconductor package 500 according to some other embodiments. FIG. 26A illustrates a cross-sectional view of the package 500 while FIG. 26B illustrates a top-down view of the package 500. The package 500 of FIGS. 26A/26B may be substantially similar to the package 500 of FIG. 25 where like reference numerals indicate like elements.

However, unlike the package 500 of FIG. 25, the package 500 of FIGS. 26A/26B does not include a patch antenna 210. Rather, FIGS. 26A/26B illustrate a package 500 comprising a coplanar waveguide (CPW) 510. CPW 510 includes a signal line 502 and ground lines 504. In some embodiments, ground lines 504 provide shielding (e.g., electromagnetic shielding) for the signal line 502. For example, the signal line 502 may be disposed between and flanked by two ground lines 504 in a top down view (see FIG. 26B). The ground lines 504 may be electrically connected to the integrated circuit die 114 and conductive features of the redistribution structure 170 by way of conductive vias 110. In some embodiments, the signal line 502 is a high frequency signal line, which is electrically connected to the integrated circuit die 114 and conductive features of the redistribution structure 170. In some embodiments, the signal line 502 is electrically connected to the integrated circuit die 114 and conductive features of the redistribution structure 170 by way of a conductive via 110 (not illustrated in FIG. 26A), which may be disposed in a different cross-section than FIG. 26A.

The CPW 510 may overlap the integrated circuit die 114 in a top down view. Furthermore, the CPW 510 may be physically separated from the integrated circuit die 114 by a dielectric feature 116. The dielectric feature 116 may help isolate the CPW 510 from interference caused by the overlap between CPW 510 and the integrated circuit die 114. In some embodiments, the thickness of the dielectric feature 116 is selected based on an operating bandwidth of the CPW 510, a k-value of the dielectric feature, an area of various features of the CPW 510, a desired efficiency of CPW 510, combinations thereof, and the like.

As illustrated by FIG. 26A, the package 500 may further include optional antennas 108 (e.g., radiating antennas). In other embodiments, the antennas 108 may be excluded. In some embodiments, another package component 600 may be bonded to a side of package 500 opposing substrate 400. The package component 600 may be an integrated circuit die or another package (e.g., comprising an encapsulated integrated circuit die and electrical routing). For example, the package component 600 may be a packaged memory module, such as LPDDR1, LPDDR2, LPDDR3, LPDDR4, or the like memory modules. Other types of package components 600 are also contemplated.

The package component 600 may be bonded to the package 500 by connectors 602 (e.g., similar to connectors 166 as described above), which extend through a dielectric layer 512 of the package 500. Dielectric layer 512 may be disposed at an exterior side of the package 500 opposite the substrate 400. The package component 600 may be electrically connected to the PWG 510, the integrated circuit die 114, and conductive features of the redistribution structure 170 by way of conductive vias 110. In some embodiments, the package component 600 may also be electrically connected to the optional antennas 108.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In various embodiments, portions of a device (e.g., a patch antenna or a CPW) overlap at least one semiconductor chip in a top down view, and this overlap may cause interference and reduced efficiency in the device if unaddressed. Thus, various embodiments improve the efficiency of the device and reduce interference from the semiconductor chip by disposing a dielectric feature between the semiconductor chip and the device (e.g., signal lines and ground element(s) of the device). A thickness of the dielectric feature is selected in order to achieve a desired efficiency for the device. The thickness may further correspond to a distance between the device and the semiconductor chip. For example, it has been observed that a relatively thick dielectric feature may provide improved isolation between the device and the semiconductor chip. In some embodiments, the thickness of the dielectric feature is selected based on an operating bandwidth of the device, a k-value of the dielectric feature, an area of various features of the device, a desired efficiency of the device, combinations thereof, and the like.

In accordance with an embodiment, a package includes an integrated circuit die encapsulated in an encapsulant, a device over the integrated circuit die, and a dielectric feature disposed between the integrated circuit die and the device. The device overlaps the integrated circuit die in a top-down view. The device includes a signal line and a ground element. A thickness of the dielectric feature is in accordance with an operating bandwidth of the device.

In accordance with an embodiment, a method includes encapsulating an integrated circuit die in an encapsulant and forming a conductive via in the encapsulant and electrically connecting the integrated circuit die to a patch antenna. The patch antenna includes a ground element, a feed line, and a radiating element electrically coupled to the ground element and the feed line. The method further includes forming a dielectric feature physically separating the ground element from the integrated circuit die. A thickness of the dielectric feature is selected in accordance with at least one of: an operating bandwidth of the patch antenna, a k-value of the dielectric feature, an area of the patch antenna, and an efficiency of the patch antenna.

In accordance with an embodiment, a method includes forming a ground element and a feed line of a patch antenna over a carrier and attaching an integrated circuit die to the ground element of the patch antenna using a dielectric feature. A thickness of the dielectric feature is selected in accordance with an operating bandwidth of the patch antenna, a k-value of the dielectric feature, an area of the patch antenna, an efficiency of the patch antenna, or a combination thereof. The method further includes forming a conductive via electrically connected to the ground element and the feed line, encapsulating the integrated circuit die and the conductive via, and electrically connecting the conductive via to the integrated circuit die using a redistribution layer. The redistribution layer is disposed on an opposing side of the integrated circuit die as the ground element. The method further includes electrically coupling a radiating element of the patch antenna to the ground element and the feed line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a package structure, the method comprising:
    encapsulating an integrated circuit die in an encapsulant external to the integrated circuit die;
    forming a conductive via in the encapsulant and electrically connecting the integrated circuit die to a patch antenna, wherein the patch antenna comprises:
        a ground element;
        a feed line; and
        a radiating element electrically coupled to the ground element and the feed line; and
    forming a dielectric feature physically separating the ground element from the integrated circuit die, wherein a thickness of the dielectric feature is selected in accordance with at least one of: an operating bandwidth of the patch antenna, a k-value of the dielectric feature, an area of the patch antenna, and an efficiency of the patch antenna.

2. The method of claim 1, wherein the dielectric feature comprises a first dielectric layer and a second dielectric layer, wherein the first dielectric layer comprises a different material than the second dielectric layer.

3. The method of claim 2, wherein the dielectric feature further comprises a third dielectric layer comprising a different material than at least one of the first dielectric layer and the second dielectric layer.

4. The method of claim 1, wherein sidewalls of the dielectric feature are co-terminus with sidewalls of the integrated circuit die.

5. The method of claim 1, wherein the dielectric feature has a different width than the integrated circuit die.

6. The method of claim 1 further comprising forming a radiating antenna extending through the encapsulant and electrically connected to the integrated circuit die.

7. A method comprising:
    forming a ground element and a feed line of a patch antenna over a carrier;
    attaching an integrated circuit die to the ground element of the patch antenna using a dielectric feature, wherein a thickness of the dielectric feature is selected in accordance with an operating bandwidth of the patch antenna, a k-value of the dielectric feature, an area of the patch antenna, an efficiency of the patch antenna, or a combination thereof;
    forming a plurality of conductive vias electrically connected to the ground element and the feed line;
    encapsulating the integrated circuit die and the plurality of conductive vias in an encapsulant, wherein the encapsulant is external to the integrated circuit die;
    electrically connecting the plurality of conductive vias to the integrated circuit die using a redistribution layer, wherein the redistribution layer is disposed on an opposing side of the integrated circuit die as the ground element; and
    electrically coupling a radiating element of the patch antenna to the ground element and the feed line.

8. The method of claim 7 further comprising:
    removing the carrier;
    after removing the carrier, forming a dielectric layer over the ground element and the feed line; and
    forming the radiating element over the dielectric layer.

9. The method of claim 8, wherein forming the radiating element comprises adhering the radiating element to the dielectric layer.

10. The method of claim 7 further comprising:
    while forming the plurality of conductive vias, forming a radiating antenna;
    encapsulating the radiating antenna with the plurality of conductive vias and the integrated circuit die; and
    electrically connecting the radiating antenna to the integrated circuit die using the redistribution layer.

11. The method of claim 7, wherein forming the ground element and the feed line comprises forming the ground element and the feed line simultaneously.

12. The method of claim 7, wherein forming the ground element and the feed line comprises forming the ground element and the feed line in different dielectric layers.

13. A method comprising:
    electroplating a ground line and a signal line over a carrier;
    attaching an integrated circuit die to the carrier using a dielectric feature, the ground line being disposed between the carrier and the integrated circuit die, wherein the ground line and the signal line are components of a device, and wherein a thickness of the dielectric feature is selected in accordance with an operating bandwidth of the device;
    encapsulating the integrated circuit die in a molding compound, wherein the molding compound is external to the integrated circuit die;
    electrically connecting the integrated circuit die to the device using a conductive via in the molding compound; and
    removing the carrier.

14. The method of claim 13, wherein the thickness of the dielectric feature is further selected in accordance with a k-value of the dielectric feature, an area of the device, an efficiency of the device, or a combination thereof.

15. The method of claim 14, wherein:
    the thickness of the dielectric feature is at least 100 μm when the operating bandwidth of the device is 60 gHz and the k-value of the dielectric feature is at least 3;
    the thickness of the dielectric feature is at least 30 μm when the operating bandwidth of the device is 60 gHz and the k-value of the dielectric feature is less than 3;
    the thickness of the dielectric feature is at least 50 μm when the operating bandwidth of the device is 77 gHz and the k-value of the dielectric feature at least 3; and
    the thickness of the dielectric feature is at least 15 μm when the operating bandwidth of the device is 77 gHz and the k-value of the dielectric feature is less than 3.

16. The method of claim 13, wherein the device is a patch antenna, and wherein the method further comprises after removing the carrier, attaching a radiating element to an opposing side of the ground line as the integrated circuit die.

17. The method of claim 13, wherein attaching an integrated circuit die to the carrier using a dielectric feature comprises disposing a portion of the dielectric feature in an opening between the ground line and the signal line.

18. The method of claim 17, wherein the opening encircles the signal line in a top down view.

19. The method of claim 13, wherein electroplating a ground line and a signal line over a carrier comprises electroplating the ground line after electroplating the signal line.

20. The method of claim 13, wherein the device is a coplanar wave guide, and wherein the signal line is disposed between the ground element and an additional ground element in a top down view.

* * * * *